United States Patent
Chen et al.

(10) Patent No.: US 9,490,430 B1
(45) Date of Patent: Nov. 8, 2016

(54) FIELD EFFECT TRANSISTORS AND METHODS OF FORMING SAME

(71) Applicants: Taiwan Semiconductor Manufacturing Company, Ltd., Hsin-Chu (TW); National Taiwan University, Taipei (TW)

(72) Inventors: Pin-Shiang Chen, Taipei (TW); Samuel C. Pan, Hsin-Chu (TW); Chee-Wee Liu, Taipei (TW); Sheng-Ting Fan, Taipei (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 14/752,566

(22) Filed: Jun. 26, 2015

(51) Int. Cl.
*H01L 29/06* (2006.01)
*H01L 49/00* (2006.01)

(52) U.S. Cl.
CPC .................... *H01L 49/003* (2013.01)

(58) Field of Classification Search
CPC ...................................... H01L 49/003
See application file for complete search history.

(56) References Cited

U.S. PATENT DOCUMENTS

| | | | | |
|---|---|---|---|---|
| 8,907,378 B2* | 12/2014 | Teo | ............. | H01L 29/2003 257/194 |
| 2007/0048913 A1* | 3/2007 | Son | ............. | H01L 21/28525 438/151 |
| 2009/0256147 A1* | 10/2009 | Kim | ............. | H01L 29/7869 257/43 |
| 2012/0273763 A1* | 11/2012 | Banerjee | ............. | H01L 49/003 257/39 |

OTHER PUBLICATIONS

Nagaosa, N., "A New State of Quantum Matter," Science, www.sciencemag.org, vol. 318, Nov. 2, 2007, pp. 758-759.
Vandenberghe, W.G., et al., "Realizing a Topological-Insulator Field-Effect Transistor using Iodostannanane," IEEE International Electron Devices Meeting (IEDM), Dec. 15-17, 2014, pp. 33.4.1-33.4.4.
Wang, H., et al., "Integrated Circuits Based on Bilayer MoS2 Transistors," Nano Letters, pubs.acs.org/NanoLett, Aug. 3, 2012, pp. 4674-4680.
Xu, Y., et al., "Large-Gap Quantum Spin Hall Insulators in Tin Films," Physical Review Letters, PRL 111, 136804, week ending Sep. 27, 2013, pp. 136804-1-136804-5.

* cited by examiner

*Primary Examiner* — Shaun Campbell
(74) *Attorney, Agent, or Firm* — Slater Matsil, LLP

(57) ABSTRACT

Semiconductor devices and methods of forming the same are provided. A first gate electrode layer is formed over a substrate. A first gate dielectric layer is formed over the first gate electrode layer. A first channel layer is formed over the first gate dielectric layer. An isolation layer is formed over the first channel layer. A second channel layer is formed over the isolation layer. A second gate dielectric layer is formed over the second channel layer. The second gate dielectric layer, the second channel layer, the isolation layer and the first channel layer are patterned to form a first opening, the first opening extending through the first gate dielectric layer, the second channel layer and the isolation layer, and into the first channel layer. A first source/drain region is formed in the first opening.

19 Claims, 26 Drawing Sheets

FIELD EFFECT TRANSISTORS AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
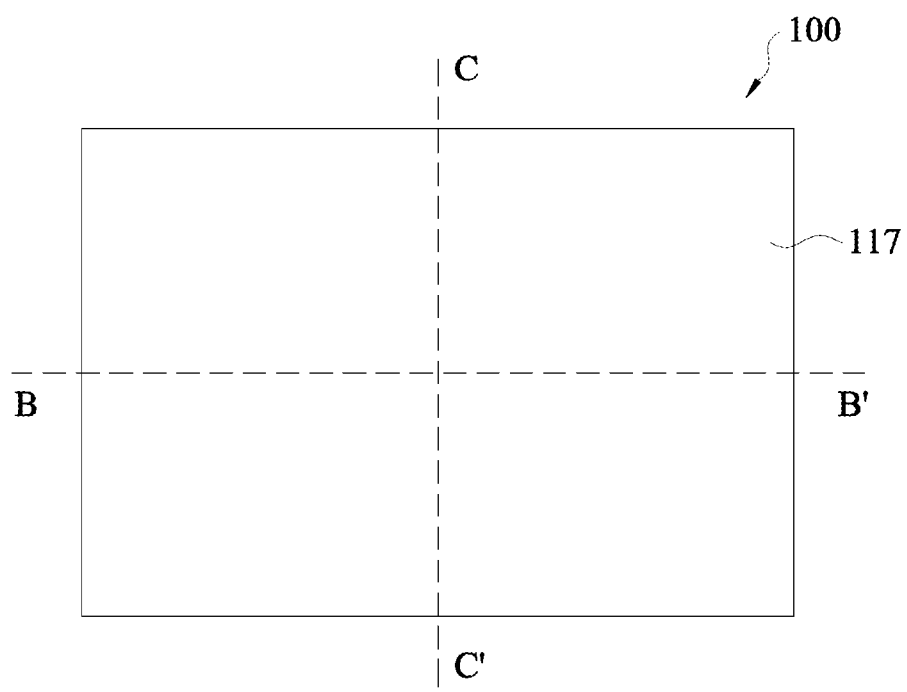
FIGS. 1A-6C illustrate various top and cross-sectional views of a fabrication process of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) and methods of forming the same are provided in accordance with various exemplary embodiments. The intermediate stages of forming the FETs are illustrated. Variations of the embodiments are discussed. Throughout the various views and illustrative embodiments, like reference numbers are used to designate like elements.

Embodiments such as those described herein provide FETs with single or multiple channel layers formed of two dimensional (2D) materials. In embodiments described below, suitable 2D materials include one to a few monolayers (such as less than about 15 monolayers) of 2D topological insulators. However, embodiments similar to those described herein may be applied to other 2D materials such as one to a few monolayers of 2D transition metal dichalcogenides (TMDCs), graphene (monolayer of graphite), boron nitride (BN), or the like. Generally, 2D materials are one or more monolayers of material held together by chemical bonds. Monolayers may be stacked upon each other to form a 2D material layer comprising individual monolayers. For example, individual monolayers of topological insulators, graphene, TMDCs, and/or BN may be stacked to create a 2D material layer.

FIGS. 1A-6C illustrate various intermediate stages of fabrication of a semiconductor device 100 in accordance with some embodiments. FIGS. 1A-6C illustrate top and cross-sectional views, wherein an "A" figure represents a top view, a "B" figure represents a first cross-sectional view along the B-B' line of the respective "A" figure, and a "C" figure represents a second cross-sectional view along the C-C' line (perpendicular to the B-B' line) of the respective "A" figure.

Figure 1B:
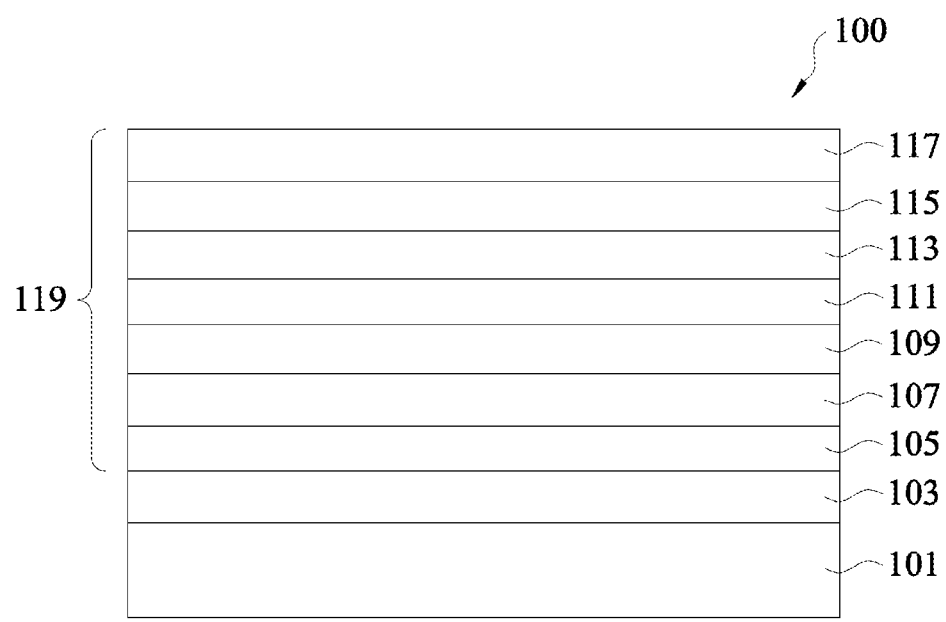
Figure 1C:

Referring to FIGS. 1A-1C, a portion of a substrate 101 is shown having a first dielectric layer 103 formed thereon. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like.

The first dielectric layer 103 is formed over the substrate 101. The first dielectric layer 103 may comprise an oxide or another dielectric material. The first dielectric layer 103 may comprise, for example, $SiO_2$, $Al_2O_3$, or the like, and may be formed by, for example, chemical vapor deposition (CVD), plasma enhanced chemical vapor deposition (PECVD), atomic layer deposition (ALD), or the like. In some embodiments, the first dielectric layer 103 is configured to electrically isolate the semiconductor device 100 from other devices formed on the substrate 101.

In some embodiments, the substrate 101 is an SOI substrate and the first dielectric layer 103 is formed over a top semiconductor layer of the SOI substrate. In other embodiments, the substrate 101 is a bottom semiconductor layer of an SOI substrate and the first dielectric layer 103 is a buried oxide (BOX) layer of the SOI substrate. In such embodiments, the top semiconductor layer of the SOI substrate is removed to expose the BOX layer.

FIGS. 1A-1C further illustrate formation of a first gate electrode layer 105 and a first gate dielectric layer 107 over the first gate electrode layer 105. As described below in greater detail, the first gate electrode layer 105 and the first gate dielectric layer 107 will be patterned to form a first gate stack of the semiconductor device 100. In some embodiments, the first gate electrode layer 105 may comprise a metallic material such as gold, silver, aluminum, copper, tungsten, molybdenum, nickel, titanium, or alloys thereof, and may be formed using physical vapor deposition (PVD), ALD, plating, the like, or a combination thereof. In some embodiments, the first gate electrode layer 105 may have a thickness between about 10 nm and about 20 nm.

In some embodiments, the first gate dielectric layer 107 may comprise one or more layers of high-k dielectric materials. Generally, a high-k dielectric material has a dielectric constant (k-value) higher than 3.9. For example, the first gate dielectric layer 107 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, or combinations thereof. Exemplary materials include $MgO_x$, $BaTi_xO_y$, $BaSr_xTi_yO_z$, $PbTi_xO_y$, $PbZr_xTi_yO_z$, or the like. In some embodiments, the first gate dielectric layer 107 may be formed using ALD, CVD, PECVD, molecular-beam deposition (MBD), or the like. In some embodiments, the first gate dielectric layer 107 may have a thickness between about 5 nm and about 15 nm.

FIGS. 1A-1C further illustrate formation of a first channel layer 109 over the first gate dielectric layer 107, a second dielectric layer 111 over the first channel layer 109, and a second channel layer 113 over the second dielectric layer 111. In the illustrated embodiment, the second dielectric layer 111 isolates the first channel layer 109 from the second channel layer 113. As described below in greater detail, the first channel layer 109, the second dielectric layer 111 and the second channel layer 113 will be patterned to form a channel region of the semiconductor device 100. In some embodiments, the second dielectric layer 111 may be formed using similar materials and methods as the first dielectric layer 103 and the description is not repeated herein. In some embodiments, the second dielectric layer 111 may have a thickness between about 5 nm and about 15 nm. In some embodiments, the first channel layer 109 and the second channel layer 113 may be formed of 2D materials. In some embodiments, suitable 2D materials may include one to a few monolayers of 2D topological insulators, TMDCs, graphene, BN, or the like, and may be formed using CVD, ALD, the like, or a combination therefore. In some embodiments, the use of 2D topological insulators may be more advantageous than the use of TMDCs or graphene. Generally, a 2D topological insulator has an insulating or semiconducting (gapped) bulk and a conducting (gapless) edge due to non-trivial topology of a band structure caused by interactions between spin and orbital degrees of freedom. In some embodiments, the semiconductor device 100 having channel region formed of a 2D topological insulator may have a larger on-state current than a semiconductor device having a channel region formed of a TMDC, and better gating characteristics and smaller off-state current than a semiconductor device having a channel region formed of graphene. Exemplary 2D topological insulators include heterostructures such as CdTe/HgTe, InAs/GaSb, and the like, stanene (a single layer of Sn atoms forming a hexagonal lattice), and various decorated stanenes having a generic chemical formula SnX, with X=F, Br, Cl, I, wherein each X atom forms a chemical bond with a corresponding Sn atom of stanene, and wherein neighboring X atoms are located on opposite sides of a plane formed by Sn atoms. In some embodiments, the decorated stanenes (SnX) may be formed by first forming stanene using molecular beam epitaxy (MBE), ALD, or the like at a process temperature of less than about 250° C. Subsequently, halogen atoms (X) are introduced into stanene using CVD, or the like at a process temperature of about 400° C. In some embodiments, the first channel layer 109 may have a thickness between about 2 nm and about 3 nm, and the second channel layer 113 may have a thickness between about 2 nm and about 3 nm. In some embodiments, the first channel layer 109 and the second channel layer 113 may have a same thickness. In other embodiments, the first channel layer 109 and the second channel layer 113 may have different thicknesses. In some embodiments wherein a channel layer (such as the first channel layer 109 or the second channel layer 113) comprises a single monolayer of a 2D topological insulator such as Fluorinated Stanene (SnF), the channel layer has a thickness of about 4.5 Å.

FIGS. 1A-1C further illustrate formation of a second gate dielectric layer 115 over the second channel layer 113 and a second gate electrode layer 117 over second gate dielectric layer 115. As described below in greater detail, the second gate electrode layer 117 and the second gate dielectric layer 115 will be patterned to form a second gate stack of the semiconductor device 100. In some embodiments, the second gate dielectric layer 115 may be formed using similar materials and methods as the first gate dielectric layer 107 and the description is not repeated herein. In some embodiments, the second gate electrode layer 117 may be formed using similar materials and methods as the first gate electrode layer 105 and the description is not repeated herein. In some embodiments, the second gate dielectric layer 115 may have a thickness between about 5 nm and about 15 nm, and the second gate electrode layer 117 may have a thickness between about 5 nm and about 15 nm.

Figure 2A:
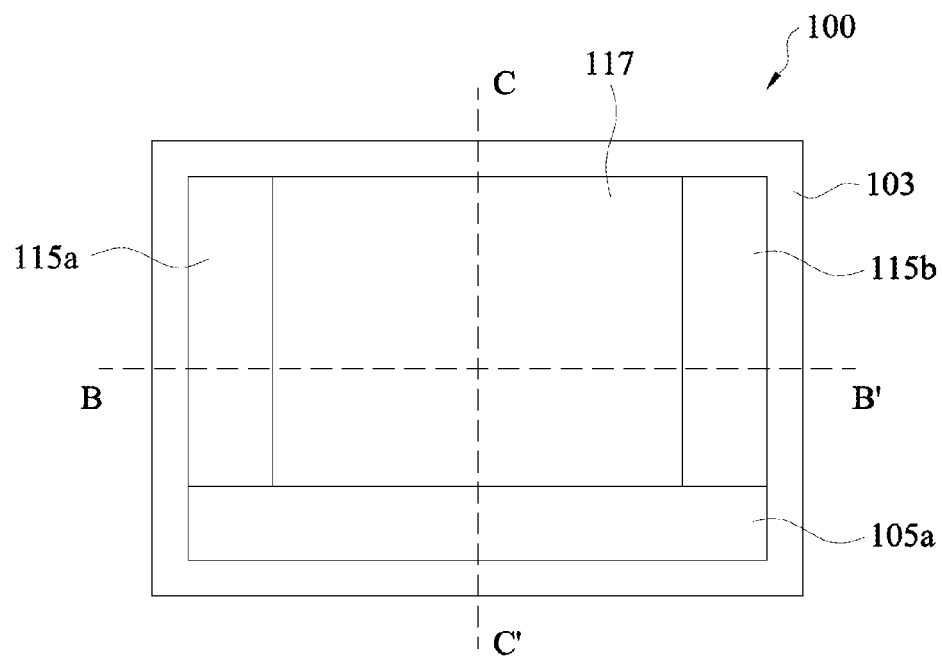
Figure 2B:
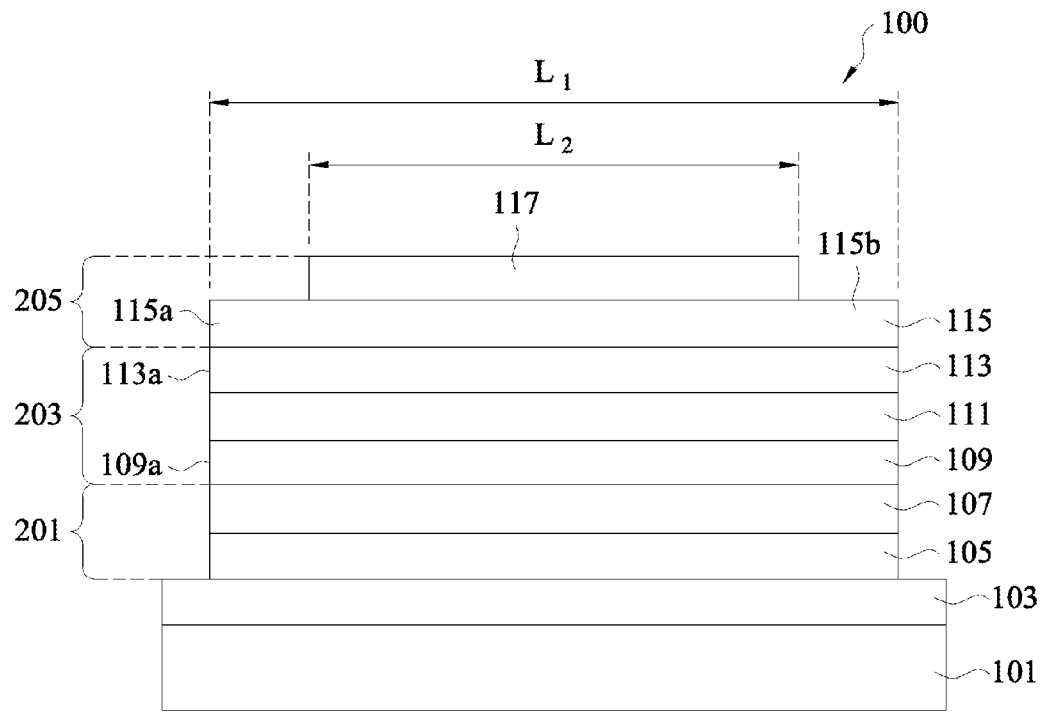
Figure 2C:
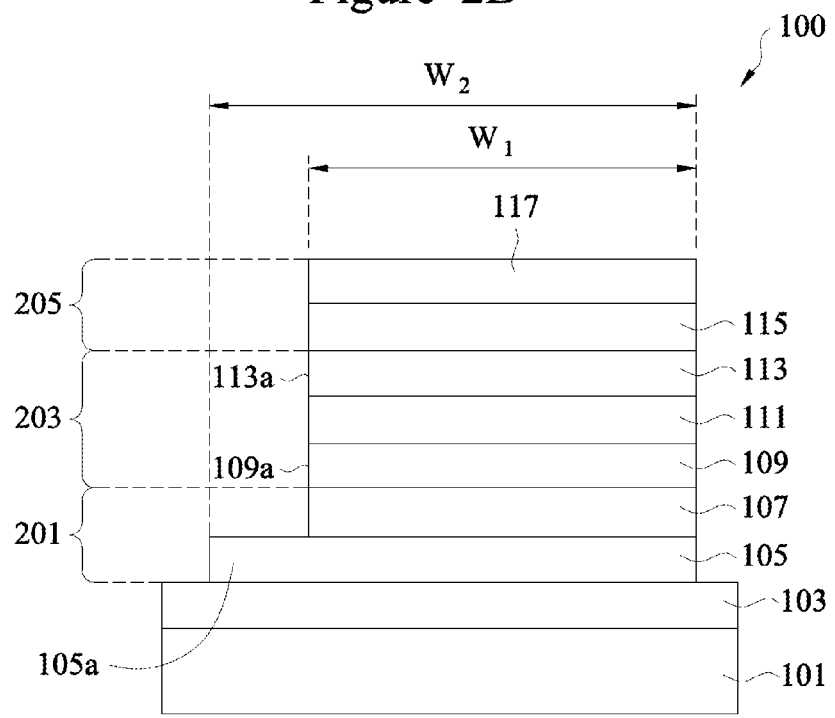

Referring to FIGS. 2A-2C, a stack 119 (see FIGS. 1B and 1C) comprising the first gate electrode layer 105, the first gate dielectric layer 107, the first channel layer 109, the second dielectric layer 111, the second channel layer 113, the second gate dielectric layer 115 and the second gate electrode layer 117 is patterned to form a first gate stack 201, a channel region 203 and a second gate stack 205. In the illustrated embodiment, the first gate stack 201 comprises the first gate dielectric layer 107 over the first gate electrode layer 105, the second gate stack 205 comprises the second gate electrode layer 117 over the second gate dielectric layer 115, and the channel region 203 comprises the second dielectric layer 111 interposed between the first channel layer 109 and the second channel layer 113. In some embodiments wherein the first channel layer 109 and the second channel layer 113 are formed of 2D topological insulators, bulks of the first channel layer 109 and the second channel layer 113 are semiconducting (gapped) while edges 109a and 113a of the first channel layer 109 and the second channel layer 113, respectively, are conducting (gapless) and act as one-dimensional wires. In the illustrated embodiment, the channel region 203 has two channel layers. However, in other embodiments, the number of channel layers may less or more than two depending on design requirements of the semiconductor device 100.

In some embodiments, the stack 119 may be patterned using photolithography techniques. Generally, photolithography involves depositing a photoresist material (not shown), which is then masked, exposed, and developed. After the photoresist mask is patterned, one or more etching process may be performed to remove unwanted portions of the underlying material. Additional masks (not shown), for example, hard masks, may be utilized in the one or more etching processes. Subsequently, excess portions of the photoresist material may be removed using, for example, an ashing process combined with a wet clean process.

Referring further to FIGS. 2A-2C, in some embodiments, after the patterning process, the first gate electrode layer 105, the first gate dielectric layer 107, the first channel layer 109, the second dielectric layer 111, the second channel layer 113, the second gate dielectric layer 115 may have a length $L_1$ between about 20 nm and about 30 nm, and the second gate electrode layer 117 may have a length $L_2$ between about 15 nm and about 20 nm. In some embodiments, the length $L_1$ is greater than the length $L_2$ such that portion 115a and 115b of the second gate dielectric layer 115 are exposed. As described below in greater detail, the portions 115a and 115b of the second gate dielectric layer 115 and layers below will be patterned to form source/drain openings. Moreover, the first gate dielectric layer 107, the first channel layer 109, the second dielectric layer 111, the second channel layer 113, the second gate dielectric layer 115, and the second gate electrode layer 117 may have a width $W_1$ between about 15 nm and about 20 nm, and the first gate electrode layer 105 may have a width $W_2$ between about 25 nm and about 40 nm. In some embodiments, the width $W_2$ is greater than the width $W_1$ such that a portion 105a of the first gate electrode layer 105 is exposed. As described below in greater detail, the portion 105a of the first gate electrode layer 105 will be used as a landing pad for a subsequently formed contact plug. In other embodiments, dimensions of the first gate electrode layer 105 and the second gate electrode layer 117 may vary provided at least a portion of the first gate electrode layer 105 is exposed to provide a landing pad for a subsequently formed contact plug and provided at least a portion of the second gate dielectric layer 115 is exposed to allow for forming source/drain regions.

Figure 3A:
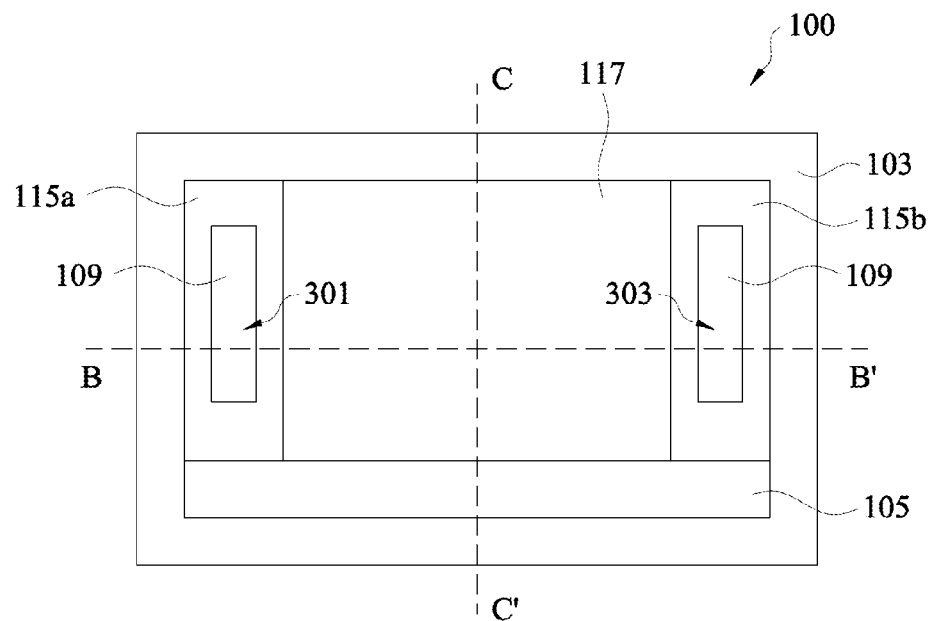
Figure 3B:
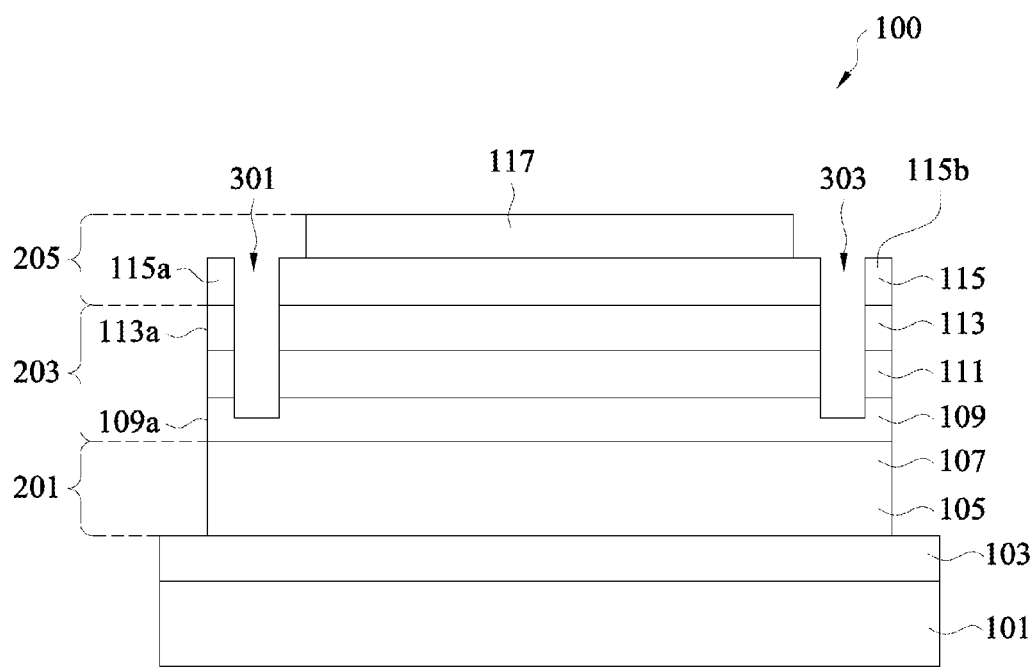
Figure 3C:
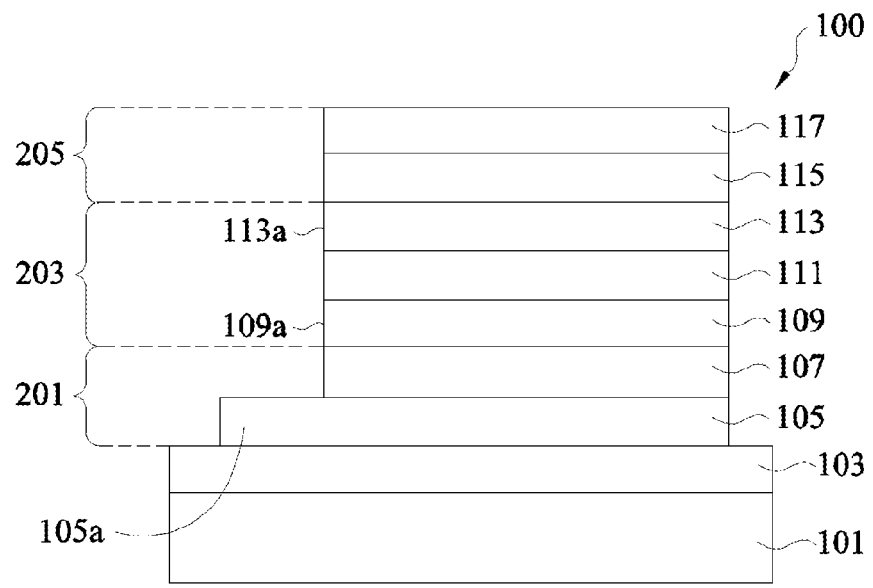

Referring to FIGS. 3A-3C, the second gate dielectric layer 115, the second channel layer 113, the second dielectric layer 111 and the first channel layer 109 are patterned to form a first opening 301 and a second opening 303. In the illustrated embodiment, the first opening 301 extends through the portion 115a of the second gate dielectric layer 115, the second channel layer 113 and the second dielectric layer 111, and extends into the first channel layer 109. The second opening 303 extends through the portion 115b of the second gate dielectric layer 115, the second channel layer 113 and the second dielectric layer 111, and extends into the first channel layer 109. In other embodiments, the first opening 301 and the second opening 303 may also extend through the first channel layer 109. As described below in greater detail, source/drain regions will be formed in the first opening 301 and the second opening 303.

In some embodiments, the second gate dielectric layer 115, the second channel layer 113, the second dielectric layer 111 and the first channel layer 109 are patterned using suitable lithography and etching methods. In some embodiments, the second gate dielectric layer 115, the second channel layer 113, the second dielectric layer 111 and the first channel layer 109 may be etched using a single etching process. In other embodiments, the second gate dielectric layer 115, the second channel layer 113, the second dielectric layer 111 and the first channel layer 109 may be etched using multiple etching processes such that each of the multiple etching processes etches a corresponding individual layer of a stack.

Figure 4A:
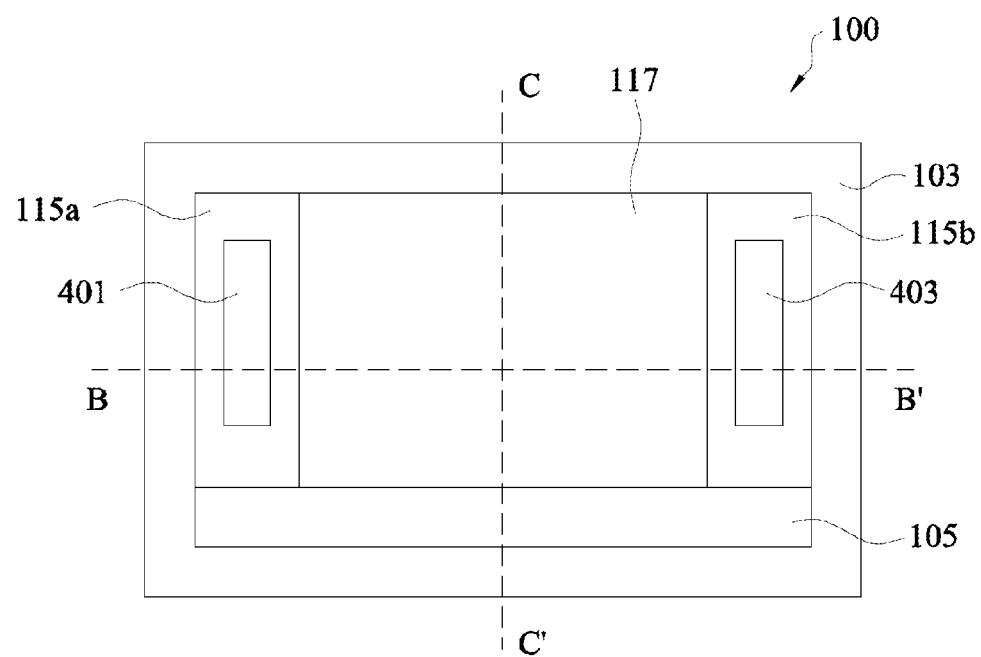
Figure 4B:
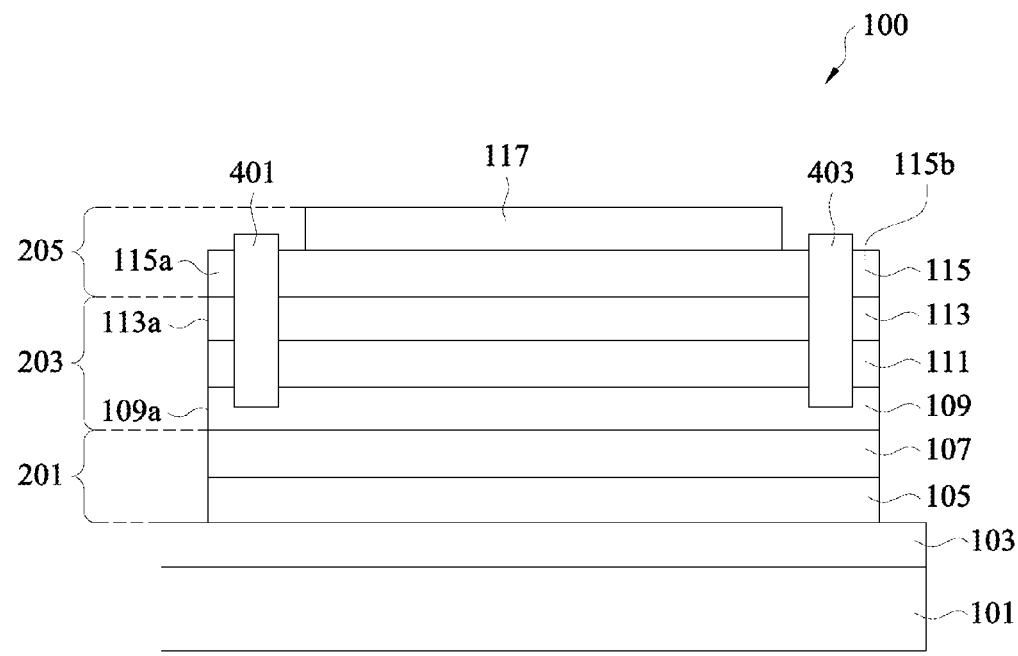
Figure 4C:
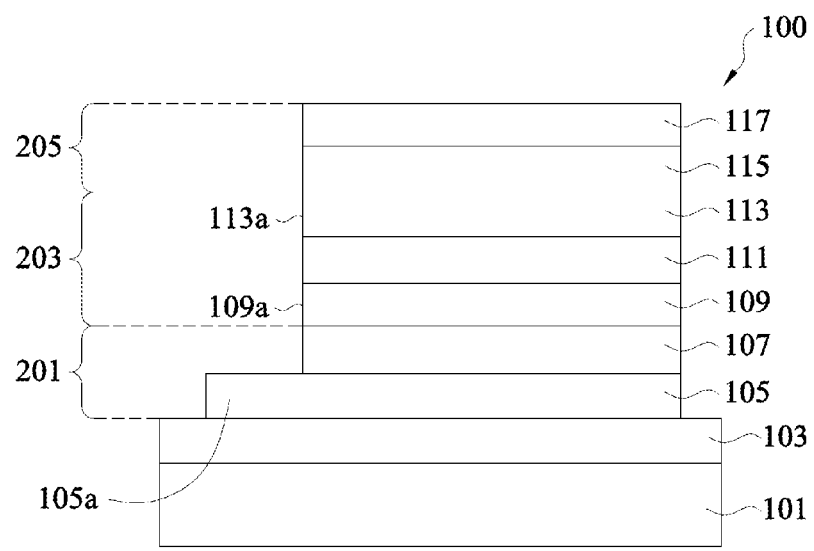

Referring to FIGS. 4A-4C, a first source/drain region 401 and a second source/drain region 403 are formed in the first opening 301 and the second opening 303, respectively. In some embodiments, the first source/drain region 401 and the second source/drain region 403 may comprise a metallic material such as gold, silver, aluminum, copper, tungsten, molybdenum, nickel, titanium, or alloys thereof, and may be formed using PVD, ALD, electro-chemical plating, electroless plating, the like, or a combination thereof. In some embodiments, a metallic material is formed in the first opening 301 and the second opening 303, and over the second gate dielectric layer 115 and the second gate electrode layer 117. Subsequently, portions of the metallic material formed over the second gate dielectric layer 115 and the second gate electrode layer 117 may be removed using an etching process, or the like. In other embodiments, before depositing a metallic material, a photoresist material (not shown) is formed over the second gate dielectric layer 115 and the second gate electrode layer 117. The photoresist material is then masked, exposed, and developed to expose the first opening 301 and the second opening 303. The metallic material is formed in the first opening 301 and the second opening 303 and over the photoresist material using, for example, PVD methods such as evaporation, sputtering, the like, or a combination thereof. Subsequently, the photoresist material and portions of the metallic material formed on the photoresist material are stripped off the second gate dielectric layer 115 and the second gate electrode layer 117. In the illustrated embodiment, top surfaces of the first source/drain region 401 and the second source/drain region 403 are higher than a top surface of the second gate dielectric layer 115. In other embodiments, the top surfaces of the first source/drain region 401 and the second source/drain region 403 may be coplanar with the top surface of the second gate dielectric layer 115.

Referring further to FIGS. 4A-4C, the first source/drain region 401 and the second source/drain region 403 are disposed in the semiconducting (gapped) bulks of the first channel layer 109 and the second channel layer 113 away from the conducting (gapless) edges 109a and 113a of the first channel layer 109 and the second channel layer 113, respectively. Therefore, the first source/drain region 401 and the second source/drain region 403 do not directly contact the conducting (gapless) edges 109a and 113a of the first channel layer 109 and the second channel layer 113, respectively. Such an arrangement of the first source/drain region 401 and the second source/drain region 403 allows for the semiconductor device 100 with improved gating characteristics and a low off-state current, since the semiconducting (gapped) bulks of the first channel layer 109 and the second channel layer 113 can be gated more easily than the conducting (gapless) edges 109a and 113a of the first channel layer 109 and the second channel layer 113, respectively. Moreover, by using 2D topological insulators as channel layers, an on-state current of the semiconductor device 100 may be increased due to conducting (gapless) edges of the 2D topological insulators.

Figure 5A:
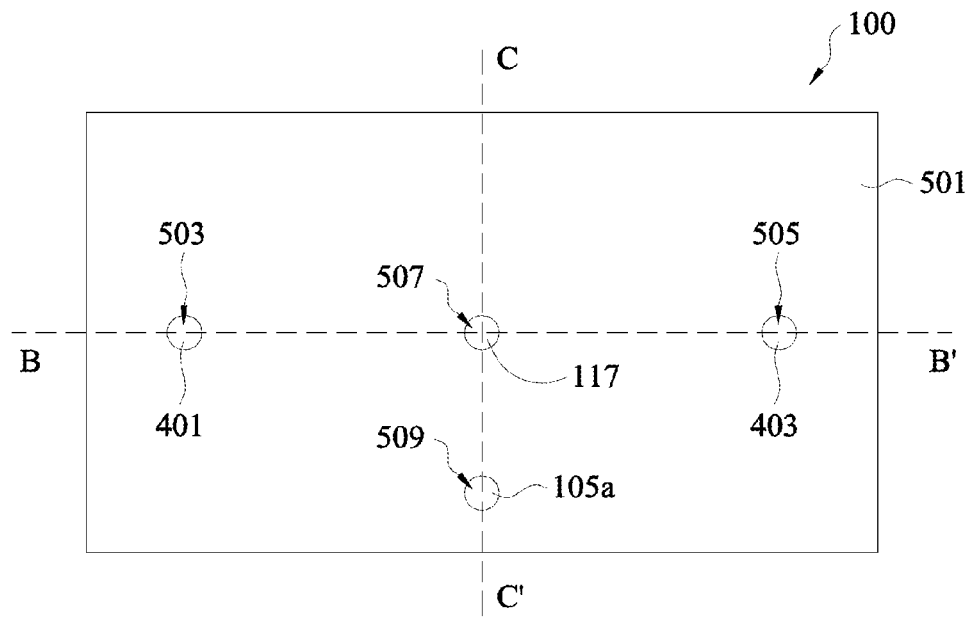
Figure 5B:
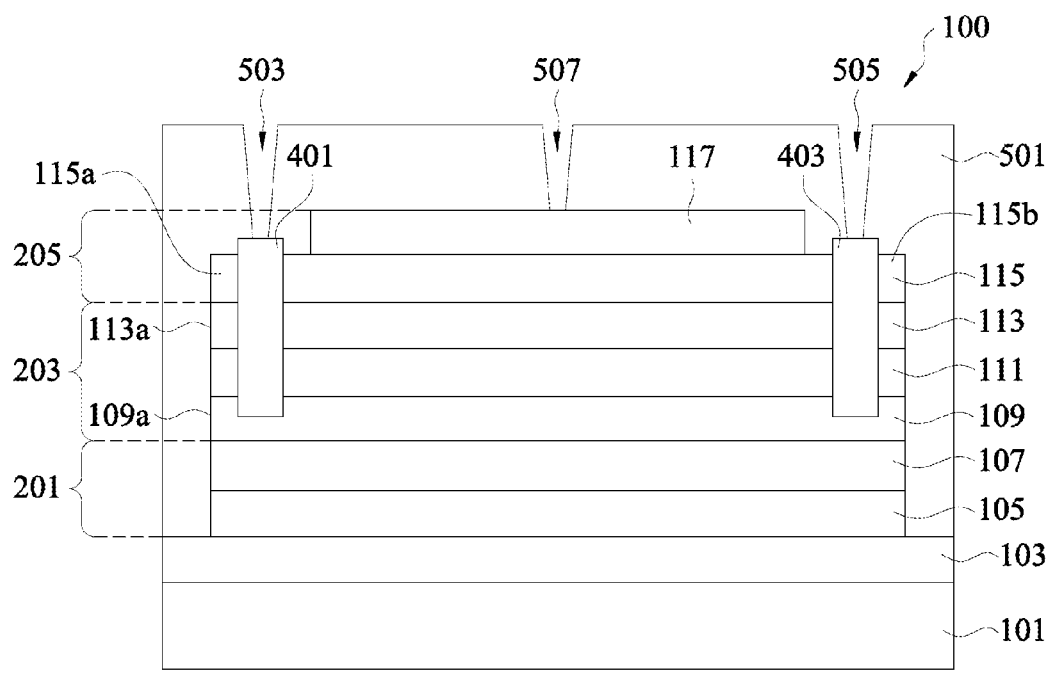
Figure 5C:
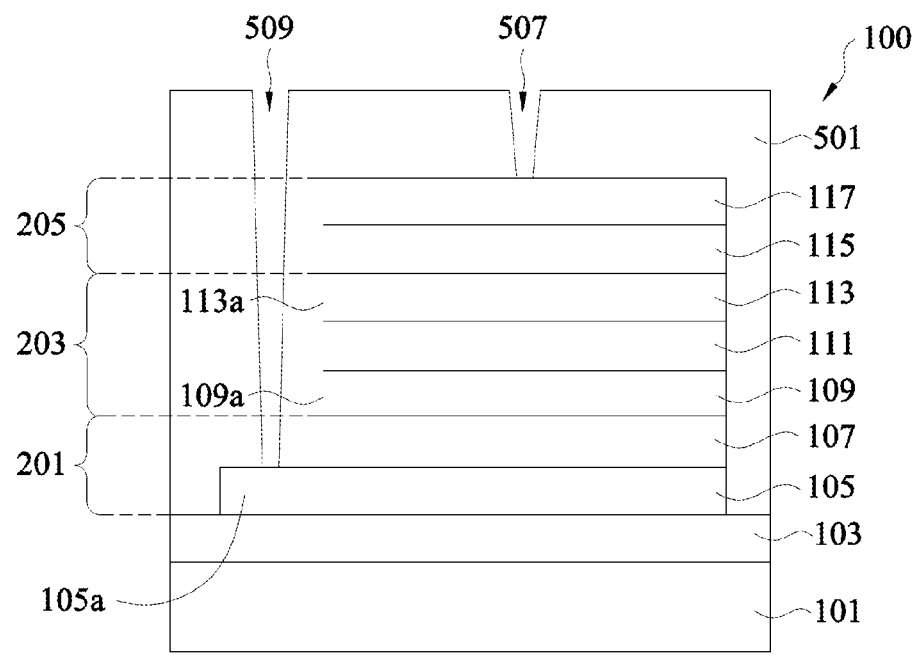

Referring to FIGS. 5A-5C, an inter-layer dielectric (ILD) 501 is formed over the second gate stack 205, the first source/drain region 401 and the second source drain region 403. In some embodiments, the ILD 501 may comprise silicon oxide, silicon nitride, silicon oxynitride, fluoride-doped silicate glass (FSG), low-k dielectrics such as carbon doped oxides, extremely low-k dielectrics such as porous carbon doped silicon oxide, combinations of these, or the like, and may be formed using, for example, chemical vapor deposition (CVD), a spin-on process, a thermal oxidation process, or the like. In some embodiments, excess portions of the dielectric material may be removed from the ILD 501 using, for example, an etch process, a grinding process, a chemical mechanical polishing (CMP) process, the like, or a combination thereof. As described below in greater detail, contact plugs will be formed in the ILD 501 to provide electrical connections to the first source/drain region 401, the second source/drain region 403, the first gate stack 201, and the second gate stack 205.

Referring further to FIGS. 5A-5C, a first opening 503, a second opening 505, a third opening 507 and a fourth opening 509 are formed in the ILD 501 to expose the first source/drain region 401, the second source/drain region 403, the second gate electrode layer 117 and the first gate electrode layer 105, respectively. In the illustrated embodiment, the fourth opening 509 exposes the portion 105a of the first gate electrode layer 105. In some embodiments, the first opening 503, the second opening 505, the third opening 507 and the fourth opening 509 may be formed using suitable lithography and etching techniques.

Figure 6A:
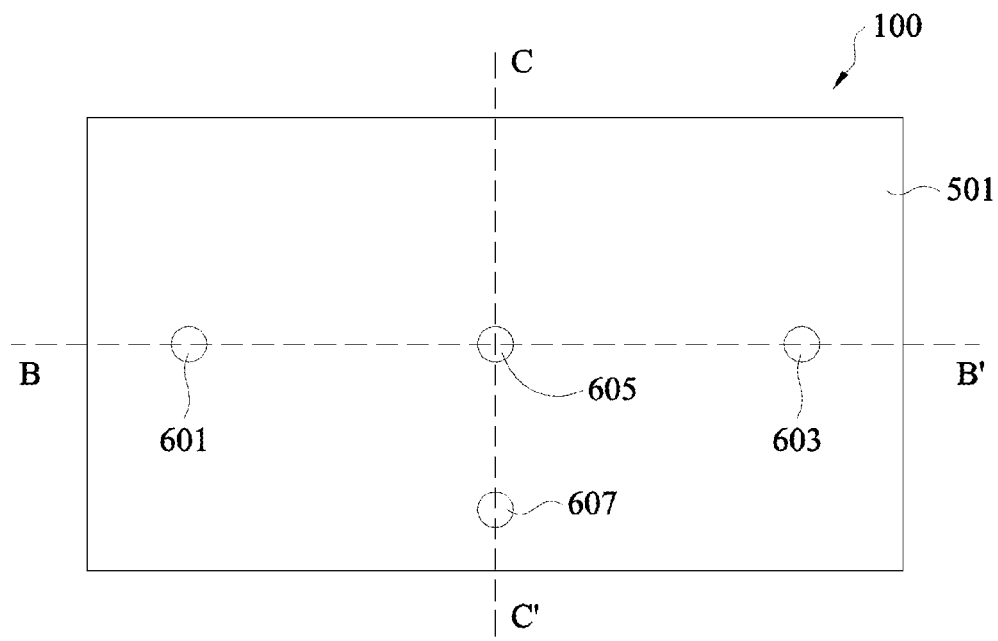
Figure 6B:
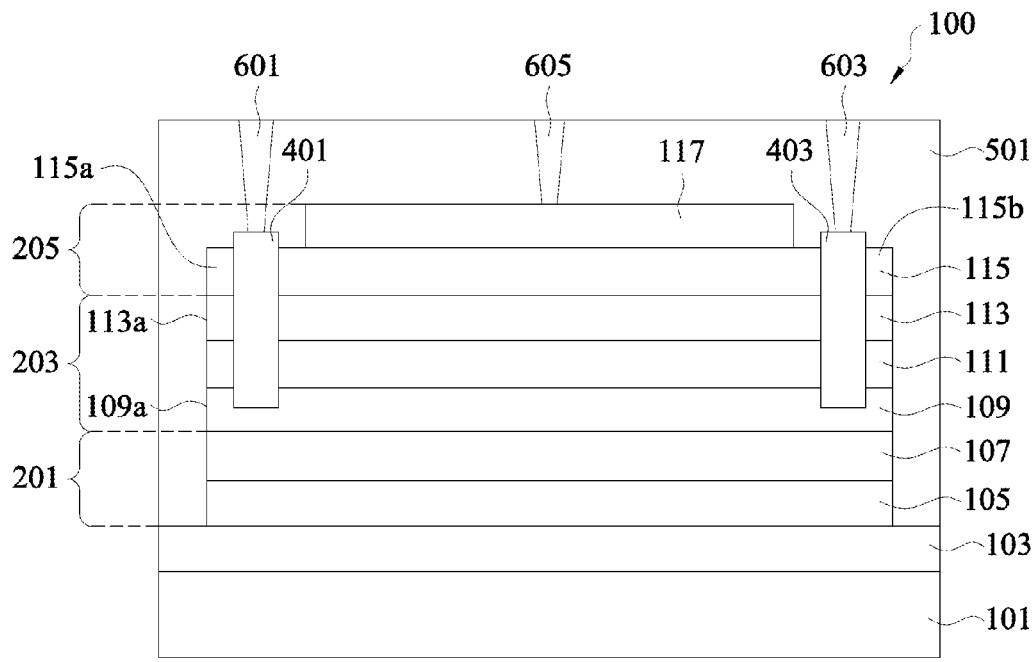
Figure 6C:
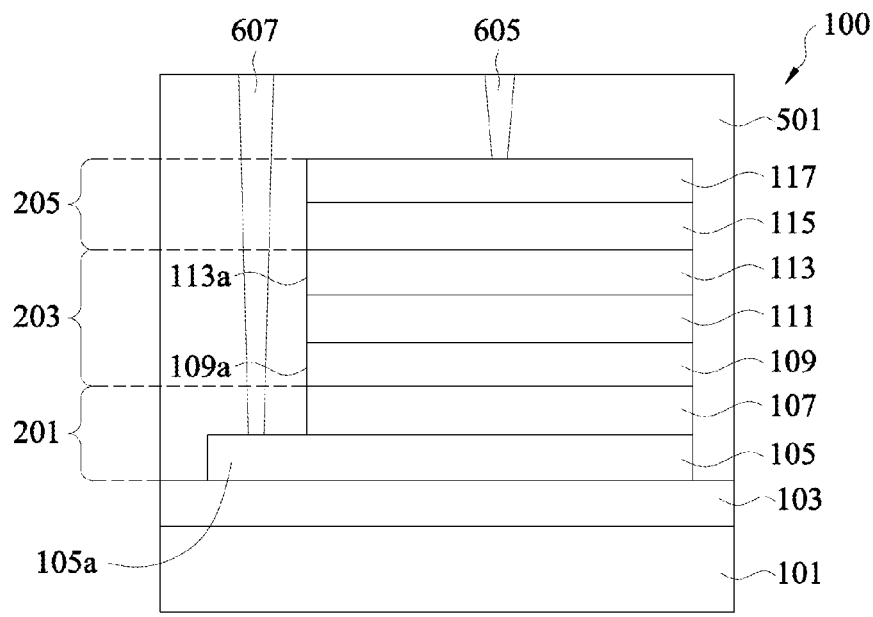
Figure 7A:
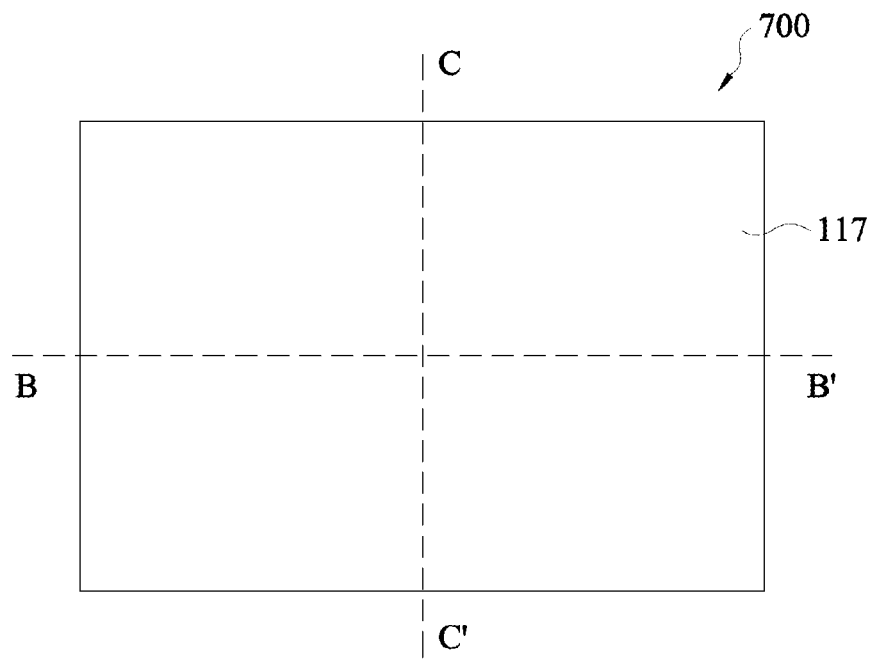
FIGS. 7A-12C illustrate various top and cross-sectional views of a fabrication process of a semiconductor device in accordance with some embodiments.
Figure 7B:
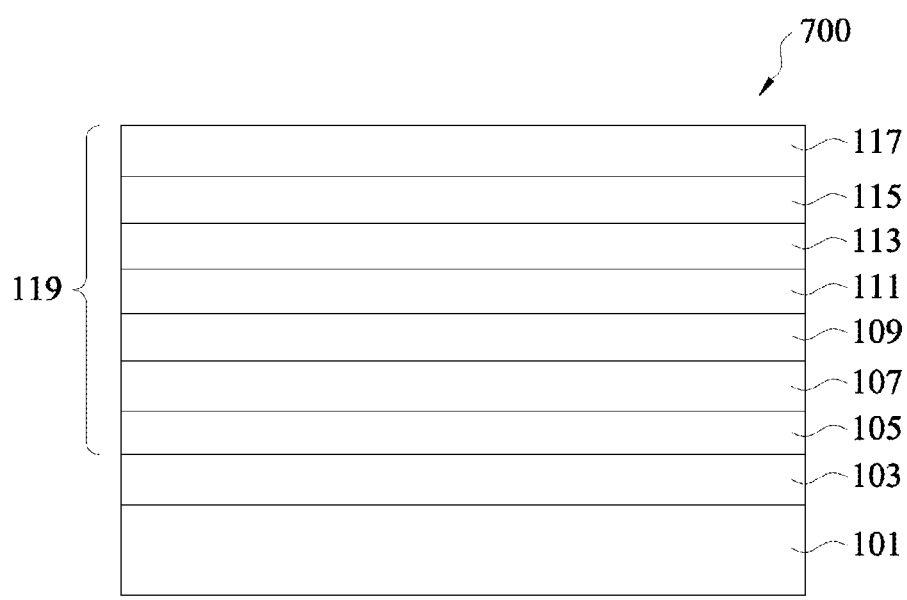
Figure 7C:
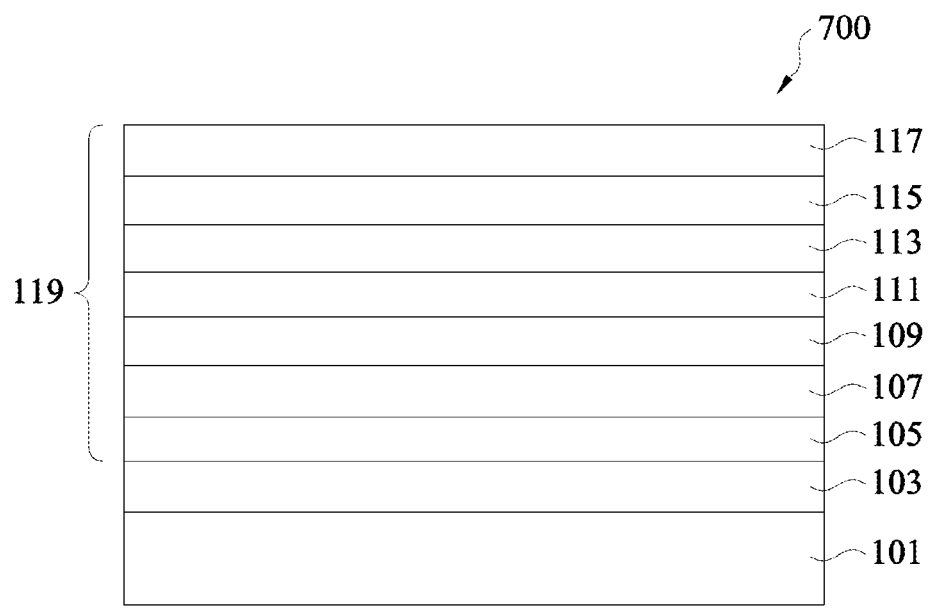
Figure 8A:
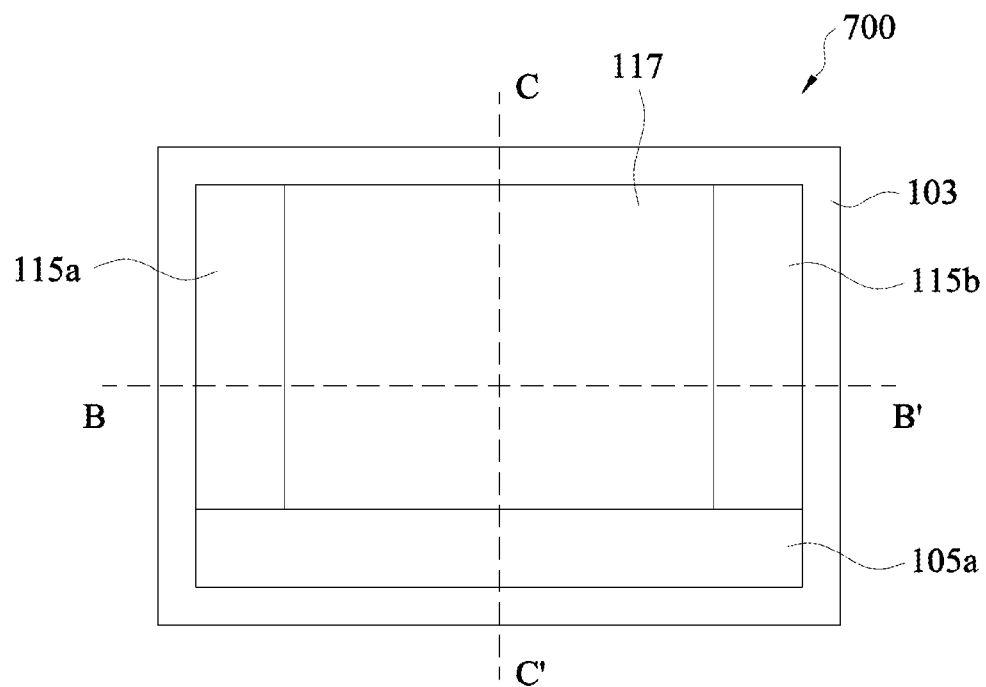
Figure 8B:
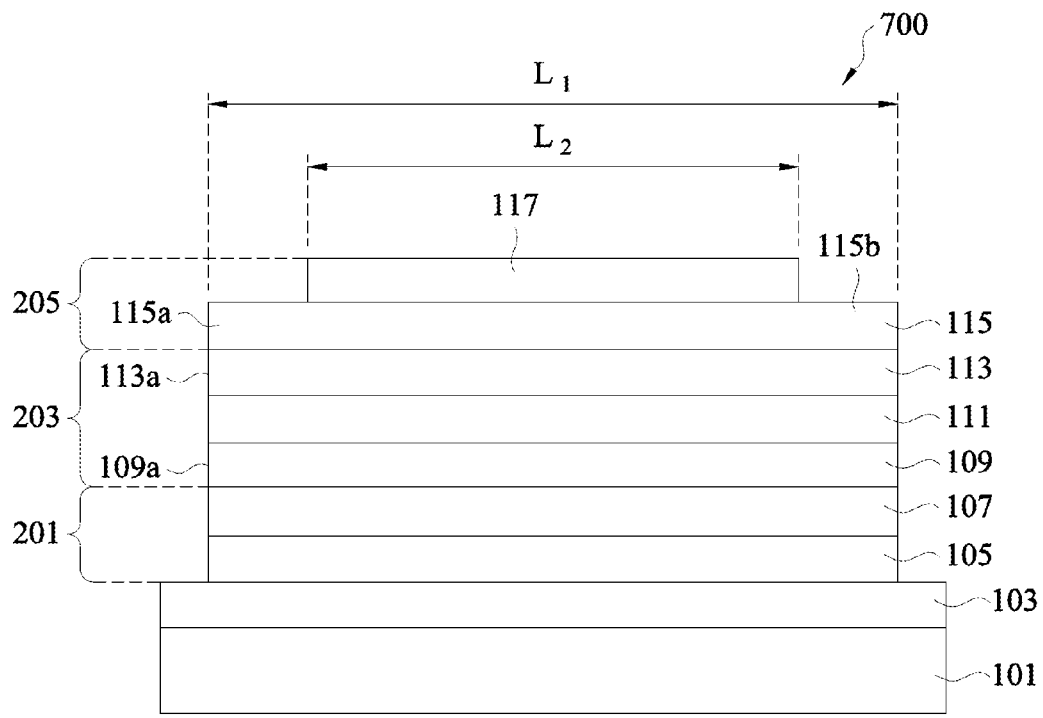
Figure 8C:
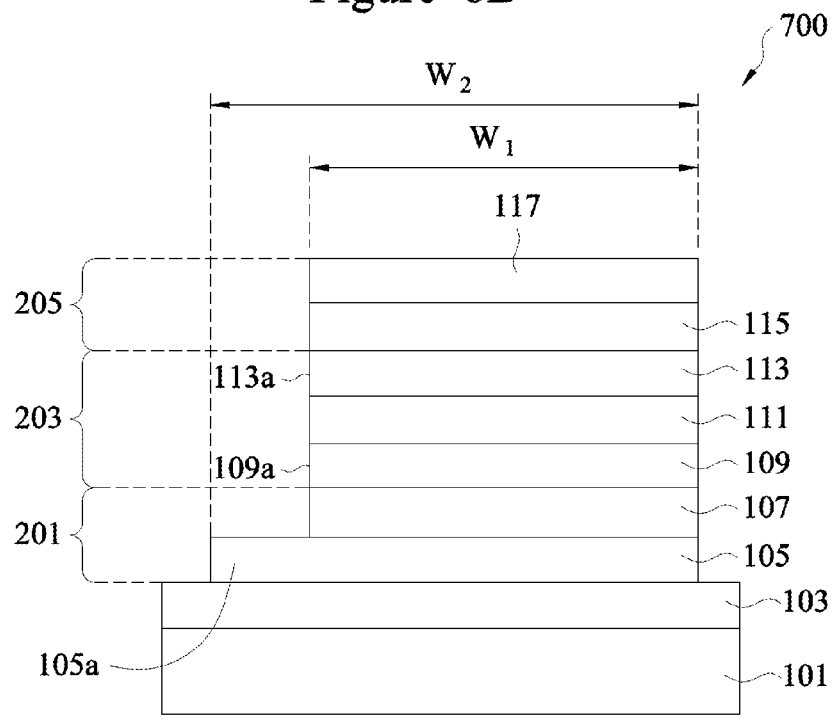

Referring to FIGS. 6A-6C, a first contact plug 601, a second contact plug 603, a third contact plug 605, and a fourth contact plug 607 are formed in the first opening 503, the second opening 505, the third opening 507 and the fourth opening 509, respectively. In the illustrated embodiment, the first contact plug 601 provides an electrical connection to the first source/drain region 401, the second contact plug 603 provides an electrical connection to the second source/drain region 403, the third contact plug 605 provides an electrical connection to the second gate electrode layer 117 of the second gate stack 205, and the fourth contact plug 607 provide an electrical connection to the first gate electrode layer 105 of the first gate stack 201. In the illustrated embodiment, top-view shapes of the first contact plug 601, the second contact plug 603, the third contact plug 605 and the fourth contact plug 607 are circles. However, in other embodiments, the top-view shapes of the first contact plug 601, the second contact plug 603, the third contact plug 605 and the fourth contact plug 607 may be ovals, polygons such as triangles, rectangles, hexagons, or the like.

Referring further to FIGS. 6A-6C, in some embodiments, one or more barrier/adhesion layers (not shown) are conformally formed over the ILD 501 and in the first opening 503, the second opening 505, the third opening 507, and the fourth opening 509. The one or more barrier/adhesion layers protect neighboring layers (such as, for example, the ILD 501) from metallic diffusion. The one or more barrier/adhesion layers may comprise titanium, titanium nitride, tantalum, tantalum nitride, or the like and may be formed using PVD, CVD, ALD, the like, or a combination thereof. In some embodiments, a seed layer (not shown) is conformally formed over the one or more barrier/adhesion layers. The seed layer may comprise copper, titanium, nickel, gold, manganese, the like, or a combination thereof, and may be formed by ALD, PVD, the like, or a combination thereof.

Subsequently, the first contact plug 601, the second contact plug 603, the third contact plug 605, and the fourth contact plug 607 are formed by filling the first opening 503, the second opening 505, the third opening 507, and the fourth opening 509, respectively, with a suitable conductive material. In some embodiments, the first contact plug 601, the second contact plug 603, the third contact plug 605, and the fourth contact plug 607 may comprise copper, a copper alloy, silver, gold, tungsten, tantalum, aluminum, and the like, and may be formed using an electro-chemical plating process, an electroless plating process, ALD, PVD, the like, or a combination thereof.

In some embodiments, excess materials overfilling the first opening 503, the second opening 505, the third opening 507 and the fourth opening 509 are removed such that topmost surfaces of the first contact plug 601, the second contact plug 603, the third contact plug 605, and the fourth contact plug are substantially coplanar with a topmost surface of the ILD 501. In some embodiments, the excess materials are removed using, for example, a mechanical grinding process, a CMP process, an etching process, the like, or a combination thereof.

In some embodiments, further manufacturing steps may be performed on the semiconductor device 100. For example, metallization layers (not shown) may be formed over the ILD 501. The metallization layers may comprise one or more dielectric layers, and one or more conductive features formed in the one or more dielectric layers. In some embodiments, the metallization layers are in electrical contact with the first contact plug 601, the second contact plug 603, the third contact plug 605, and the fourth contact plug 607 and electrically interconnect the semiconductor device 100 to other devices formed on the substrate 101. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 101 may be singulated into separate dies, which may further undergo various packaging processes.

FIGS. 7A-12C illustrate various intermediate stages of fabrication of a semiconductor device 700 in accordance with some embodiments. FIGS. 7A-12C illustrate top and cross-sectional views, wherein an "A" figure represents a top view, a "B" figure represents a first cross-sectional view along the B-B' line of the respective "A" figure, and a "C" figure represents a second cross-sectional view along the C-C' line (perpendicular to the B-B' line) of the respective "A" figure.

FIGS. 7A-8C illustrate features and processes similar to those described above with reference to FIGS. 1A-2C, with similar elements labeled by similar numerical references, and the description is not repeated herein.

Figure 9A:
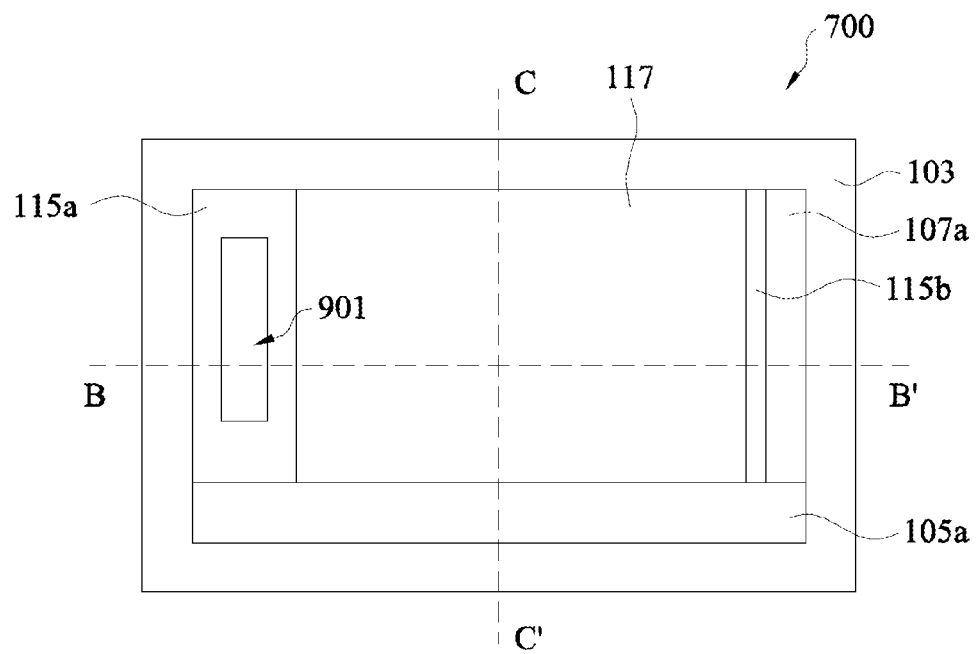
Figure 9B:
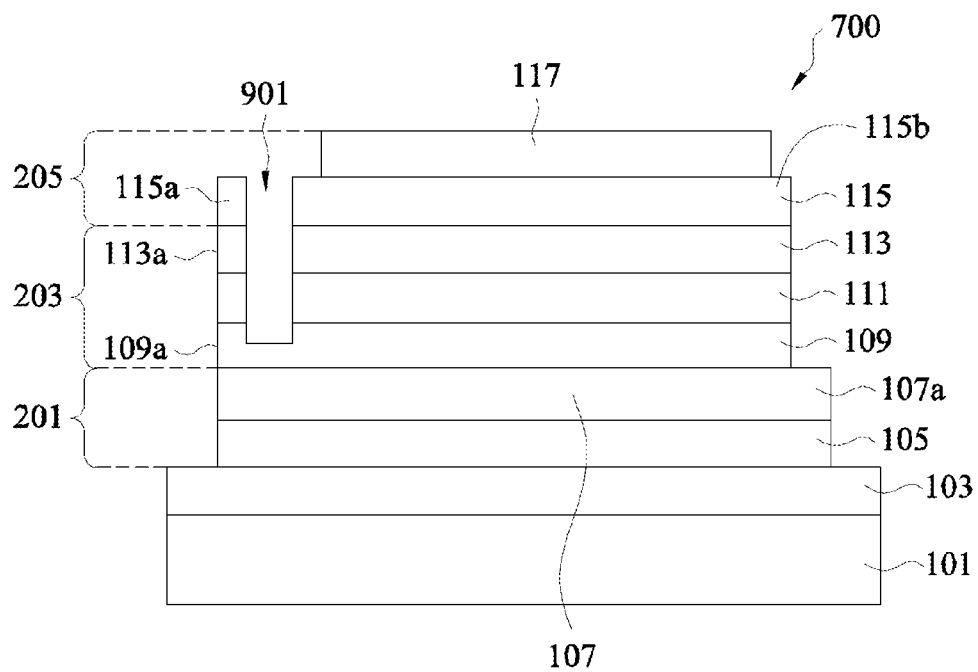
Figure 9C:
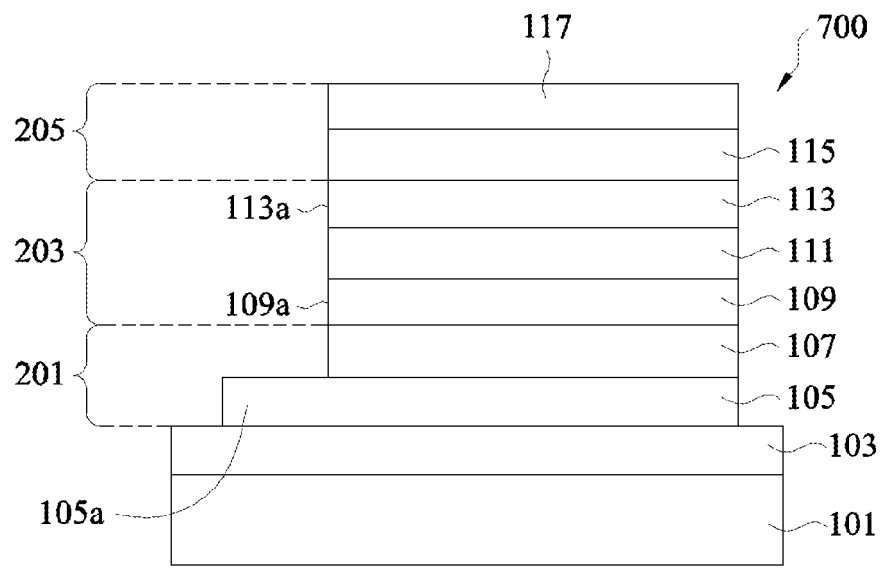

Referring to FIGS. 9A-9C, the second gate dielectric layer 115, the second channel layer 113, the second dielectric layer 111, and the first channel layer 109 are patterned to form an opening 901 and expose a portion 107a of the first gate dielectric layer 107. In the illustrated embodiment, the opening 901 extends through the portion 115a of the second gate dielectric layer 115, the second channel layer 113 and the second dielectric layer 111, and extends into the first channel layer 109. In other embodiments, the opening 901 may also extend through the first channel layer 109. As described below in greater detail, source/drain regions will be formed in the opening 901 and over the portion 107a of the first gate dielectric layer 107. In some embodiments, the second gate dielectric layer 115, the second channel layer 113, the second dielectric layer 111 and the first channel layer 109 may patterned using methods described above with reference to FIGS. 3A-3C and the description is not repeated herein.

Figure 10A:
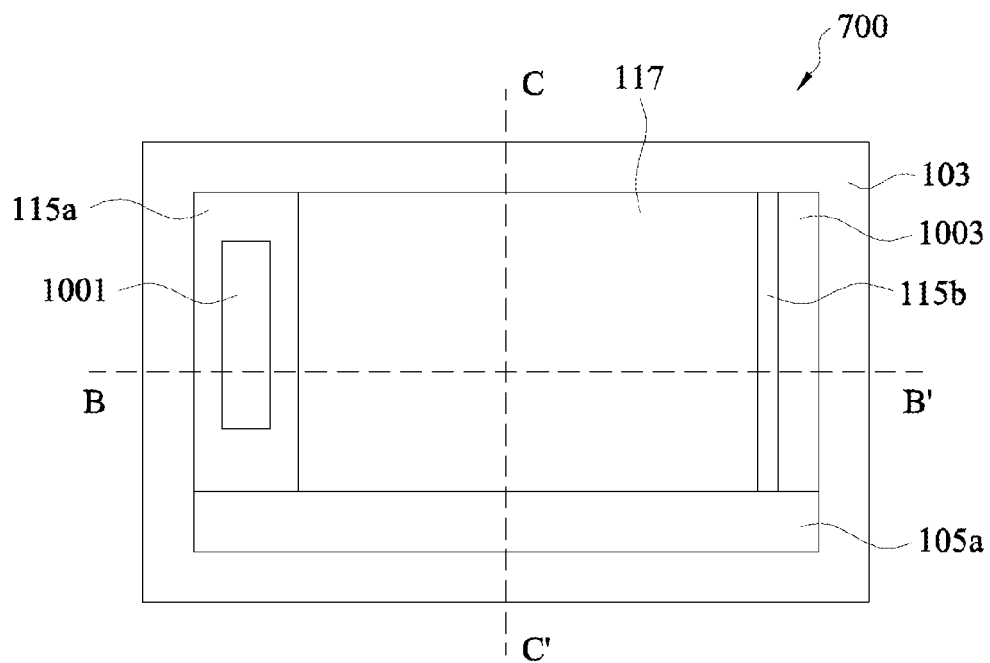
Figure 10B:
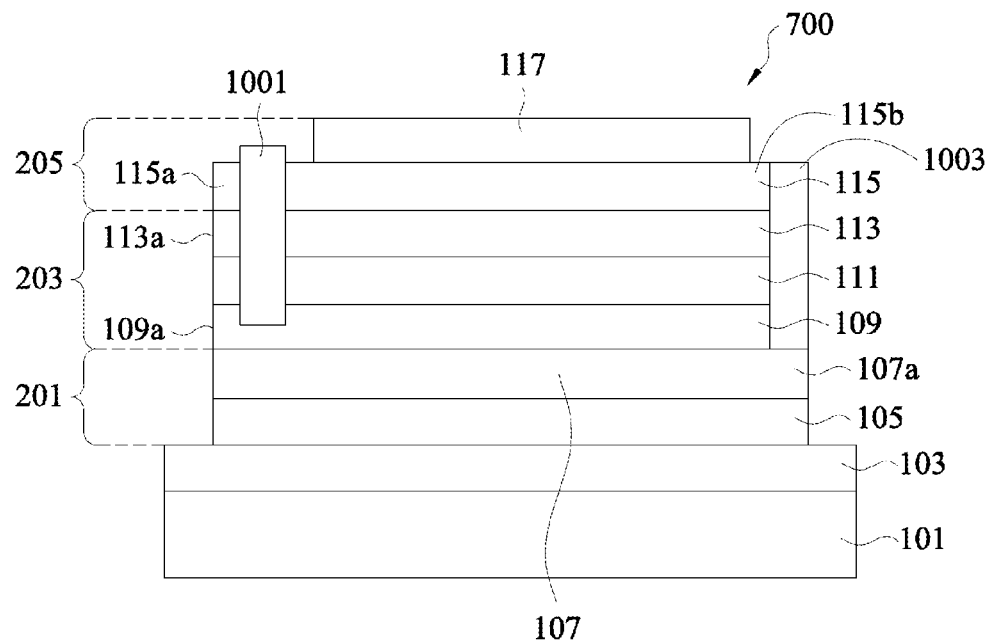
Figure 10C:
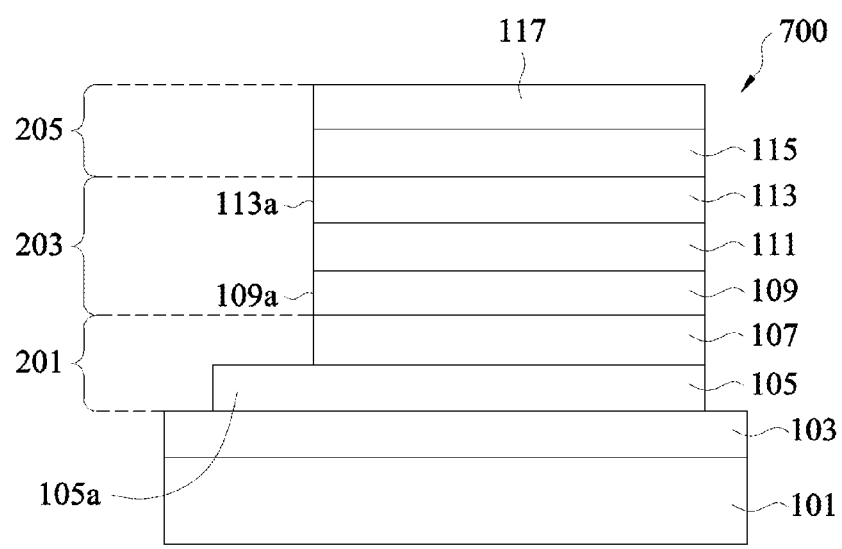
Figure 11A:
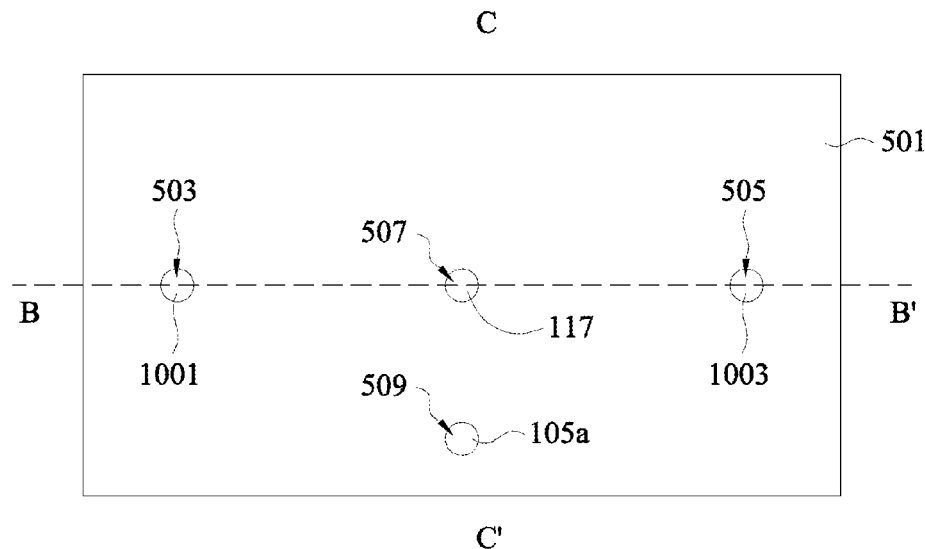
Figure 11B:
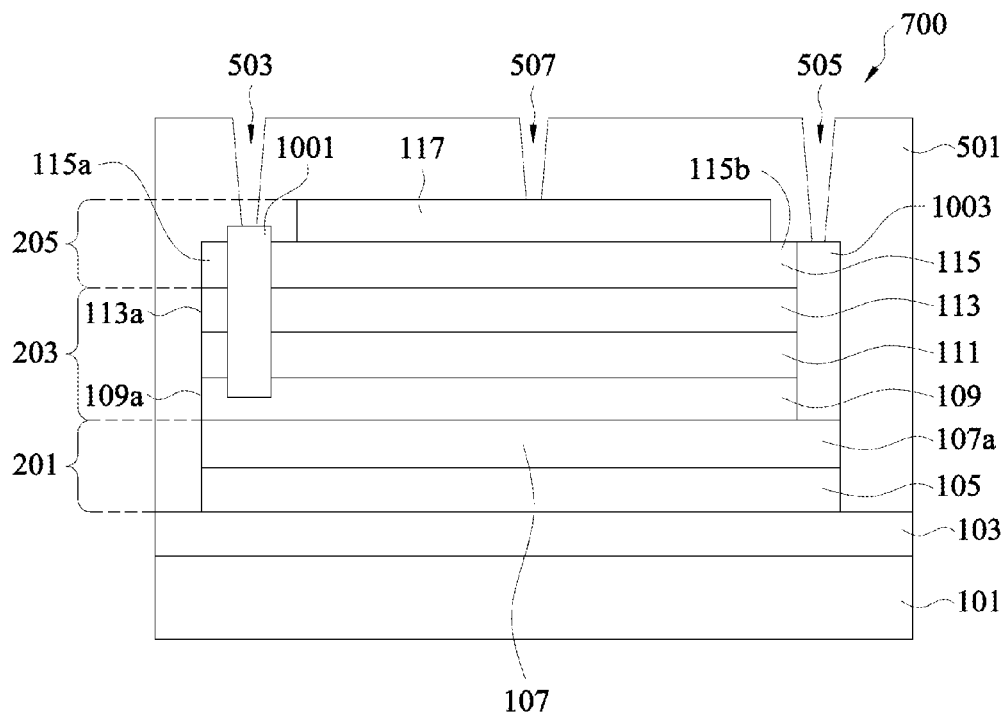
Figure 11C:
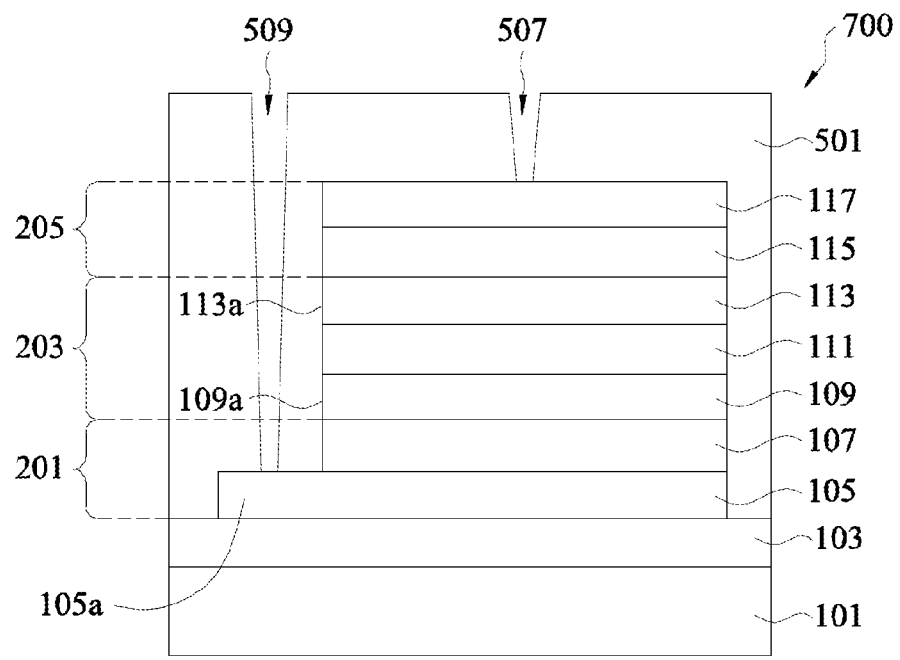
Figure 12A:
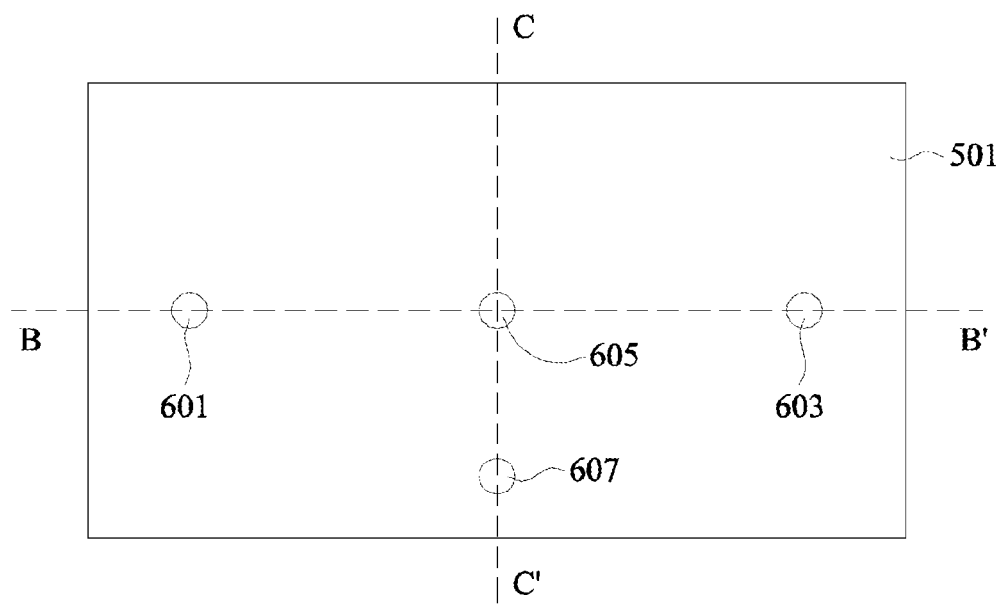
Figure 12B:
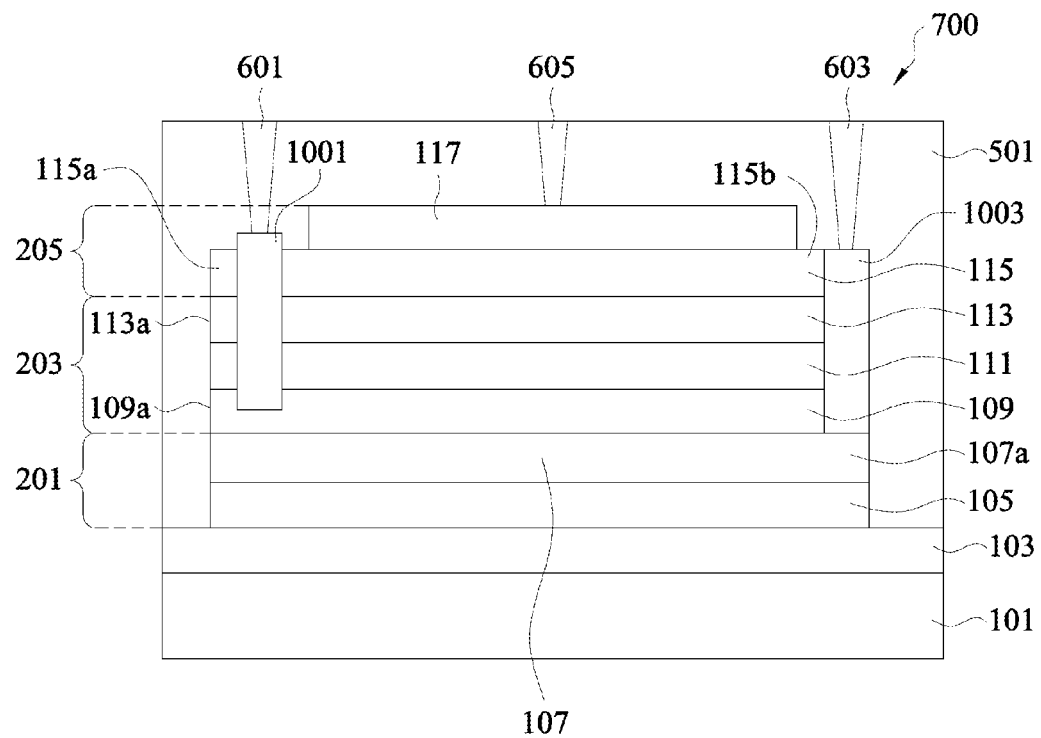
Figure 12C:
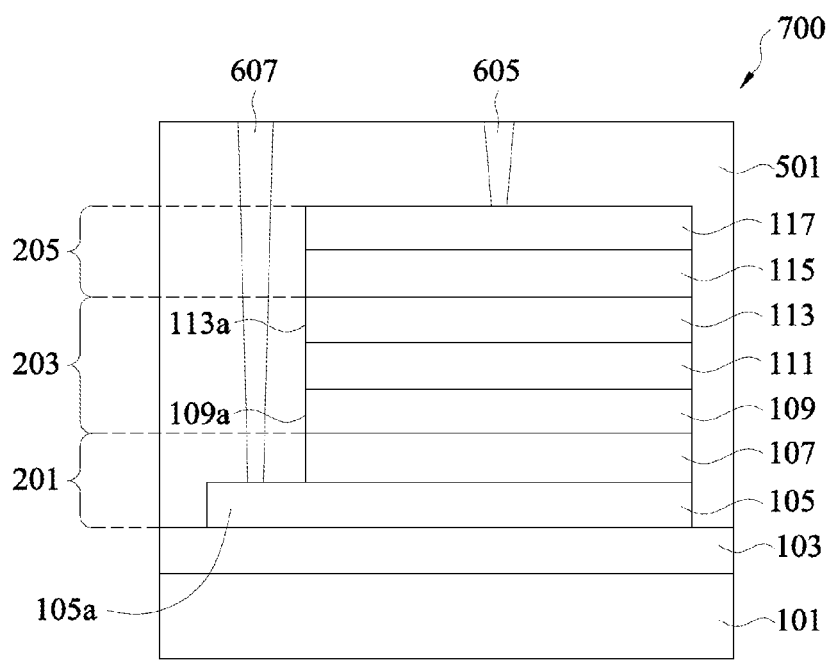

Referring to FIGS. 10A-10C, a first source/drain region 1001 is formed in the opening 901 and a second source/drain region 1003 is formed over the portion 107a of the first gate dielectric layer 107 and along sidewalls of the second gate dielectric layer 115, the second channel layer 113, the second dielectric layer 111, and the first channel layer 109. In some embodiments, the first source/drain region 1001 and the second source/drain region 1003 may be formed using similar materials and methods as the first source/drain region 401 and the second source/drain region 403, described above with reference to FIGS. 4A-4C, and the description is not repeated herein. In the illustrated embodiment, a top surface of the first source/drain region 1001 is higher than a top surface of the second gate dielectric layer 115. In other embodiments, the top surface of the first source/drain region 1001 may be coplanar with the top surface of the second gate dielectric layer 115. In the illustrated embodiment, a top surface of the second source/drain region 1003 is coplanar with the top surface of the second gate dielectric layer 115. In other embodiments, the top surface of the second source/drain region 1003 may be higher than the top surface of the second gate dielectric layer 115.

Referring further to FIGS. 10A-10C, in some embodiments, the first source/drain region 1001 is disposed in the semiconducting (gapped) bulks of the first channel layer 109 and the second channel layer 113 away from the conducting (gapless) edges 109a and 113a of the first channel layer 109 and the second channel layer 113, respectively, while the second source/drain region 1003 is disposed along the sidewalls of the second gate dielectric layer 115, the second channel layer 113, the second dielectric layer 111, and the first channel layer 109. Accordingly, the first source/drain region 1001 does not directly contact the conducting (gapless) edges 109a and 113a of the first channel layer 109 and the second channel layer 113, respectively, while the second source/drain region 1003 directly contacts the conducting (gapless) edges 109a and 113a of the first channel layer 109 and the second channel layer 113, respectively. Such an arrangement of the first source/drain region 1001 and the second source/drain region 1003 allows for the semiconductor device 700 with improved on-state current, while maintaining good gating characteristics and a low off-state current. In the illustrated embodiment, the on-state current of the semiconductor device 700 is increased since resistance between the second source/drain region 1003 and the channel region 203 is decreased. At the same time, good gating characteristics and a low off-state current are maintained since the semiconducting (gapped) bulks of the first channel layer 109 and the second channel layer 113 can be gated more easily than the conducting (gapless) edges 109a and 113a of the first channel layer 109 and the second channel layer 113, respectively.

FIGS. 11A-12C illustrate features and processes similar to those described above with reference to FIGS. 5A-6C, with similar elements labeled by similar numerical references, and the description is not repeated herein.

Figure 13A:
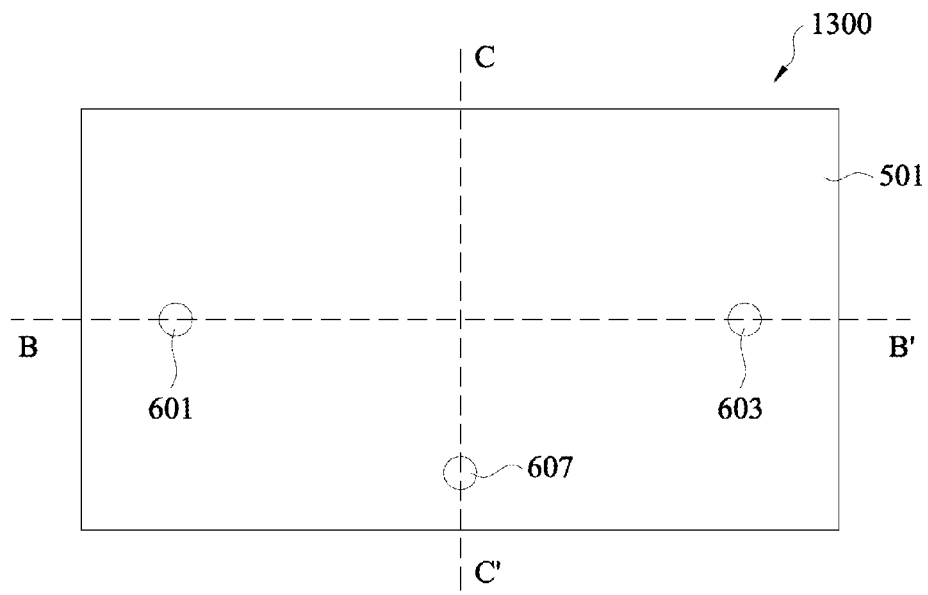
FIGS. 13A-13C illustrate various top and cross-sectional views of a semiconductor device in accordance with some embodiments.
Figure 13B:
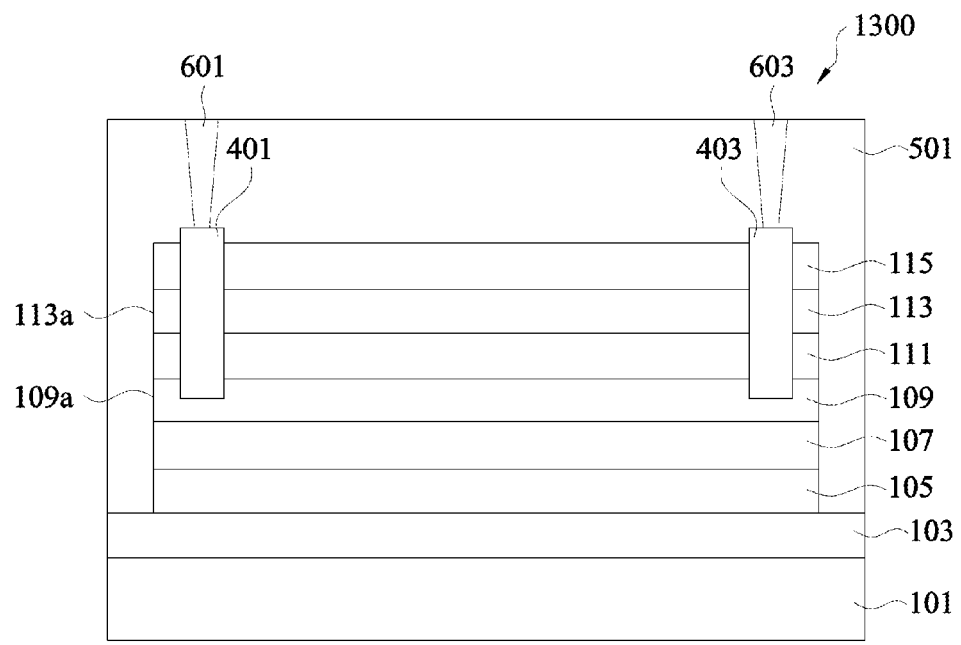
Figure 13C:
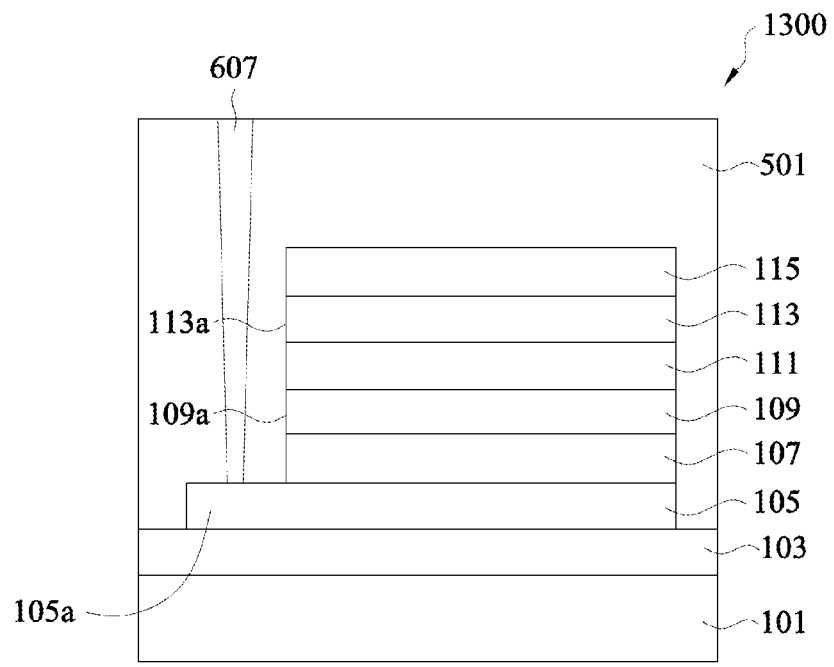

FIGS. 13A-13C illustrate various top and cross-sectional views of a semiconductor device 1300 in accordance with some embodiments, wherein FIG. 13A represents a top view, FIG. 13B represents a first cross-sectional view along the B-B' line of FIG. 13A, and FIG. 13C represents a second cross-sectional view along the C-C' line (perpendicular to the B-B' line) of FIG. 13A. In some embodiments, the semiconductor device 1300 may be formed using similar material and methods as the semiconductor device 100 described above with reference to FIGS. 1A-6C, with similar elements labeled by similar numerical references, and the description is not repeated herein. In some embodiments, while forming a stack 119 as described above with reference to FIGS. 1A-1C, the second gate electrode layer 117 may be omitted. Accordingly, in the illustrated embodiment, the semiconductor device 1300 has a single gate stack comprising the first gate dielectric layer 107 over the first gate electrode layer 105.

Figure 14A:
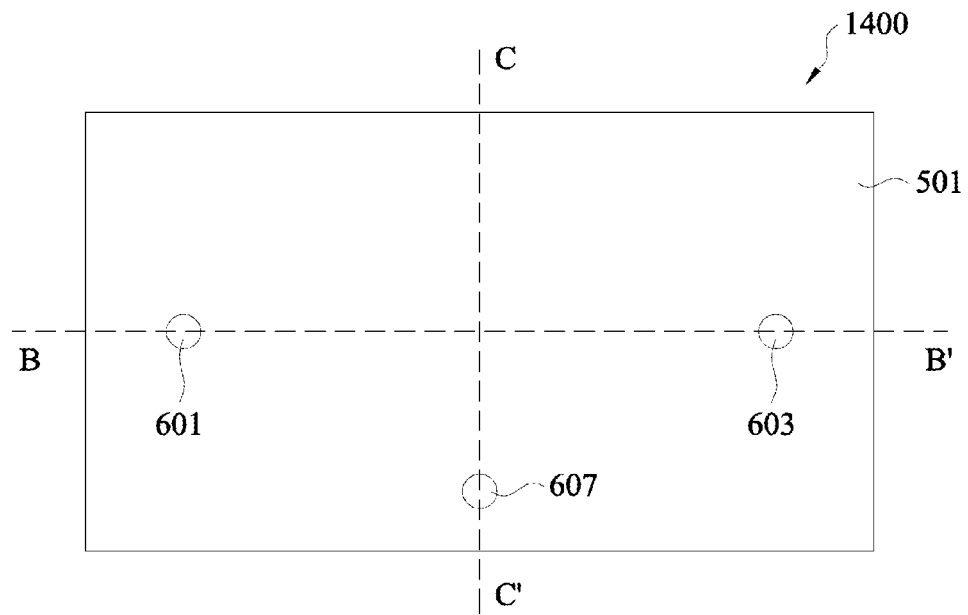
FIGS. 14A-14C illustrate various top and cross-sectional views of a semiconductor device in accordance with some embodiments.
Figure 14B:
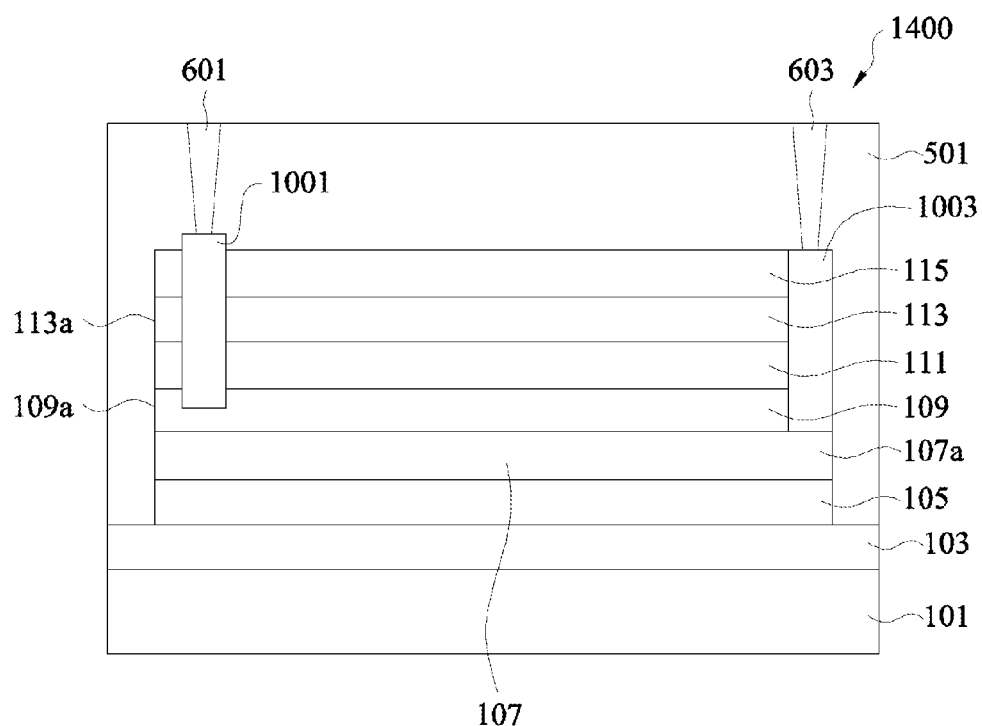
Figure 14C:
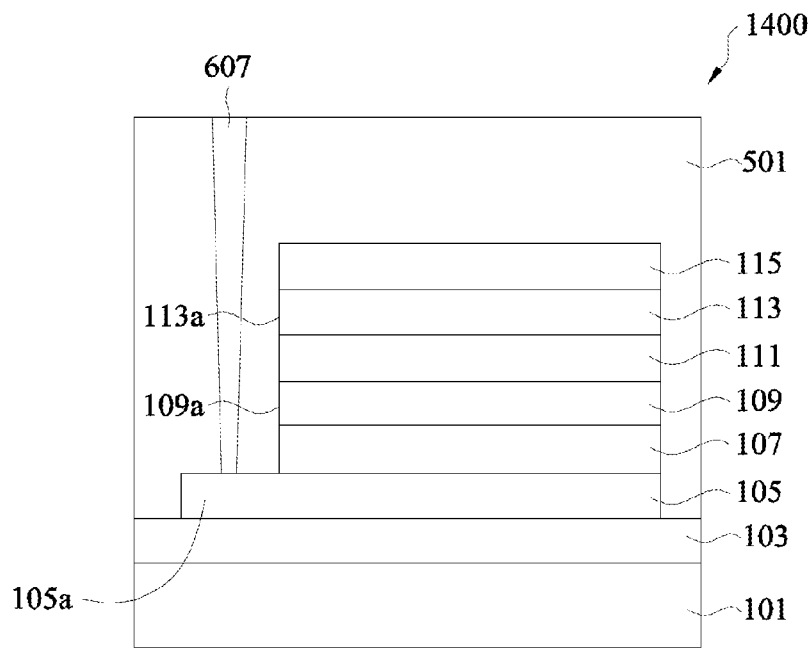

FIGS. 14A-14C illustrate various top and cross-sectional views of a semiconductor device 1400 in accordance with some embodiments, wherein FIG. 14A represents a top view, FIG. 14B represents a first cross-sectional view along the B-B' line of FIG. 14A, and FIG. 14C represents a second cross-sectional view along the C-C' line (perpendicular to the B-B' line) of FIG. 14A. In some embodiments, the semiconductor device 1400 may be formed using similar material and methods as the semiconductor device 700 described above with reference to FIGS. 7A-12C, with similar elements labeled by similar numerical references, and the description is not repeated herein. In some embodiments, while forming a stack 119 as described above with reference to FIGS. 7A-7C, the second gate electrode layer 117 may be omitted. Accordingly, in the illustrated embodiment, the semiconductor device 1400 has a single gate stack comprising the first gate dielectric layer 107 over the first gate electrode layer 105.

Figure 15:
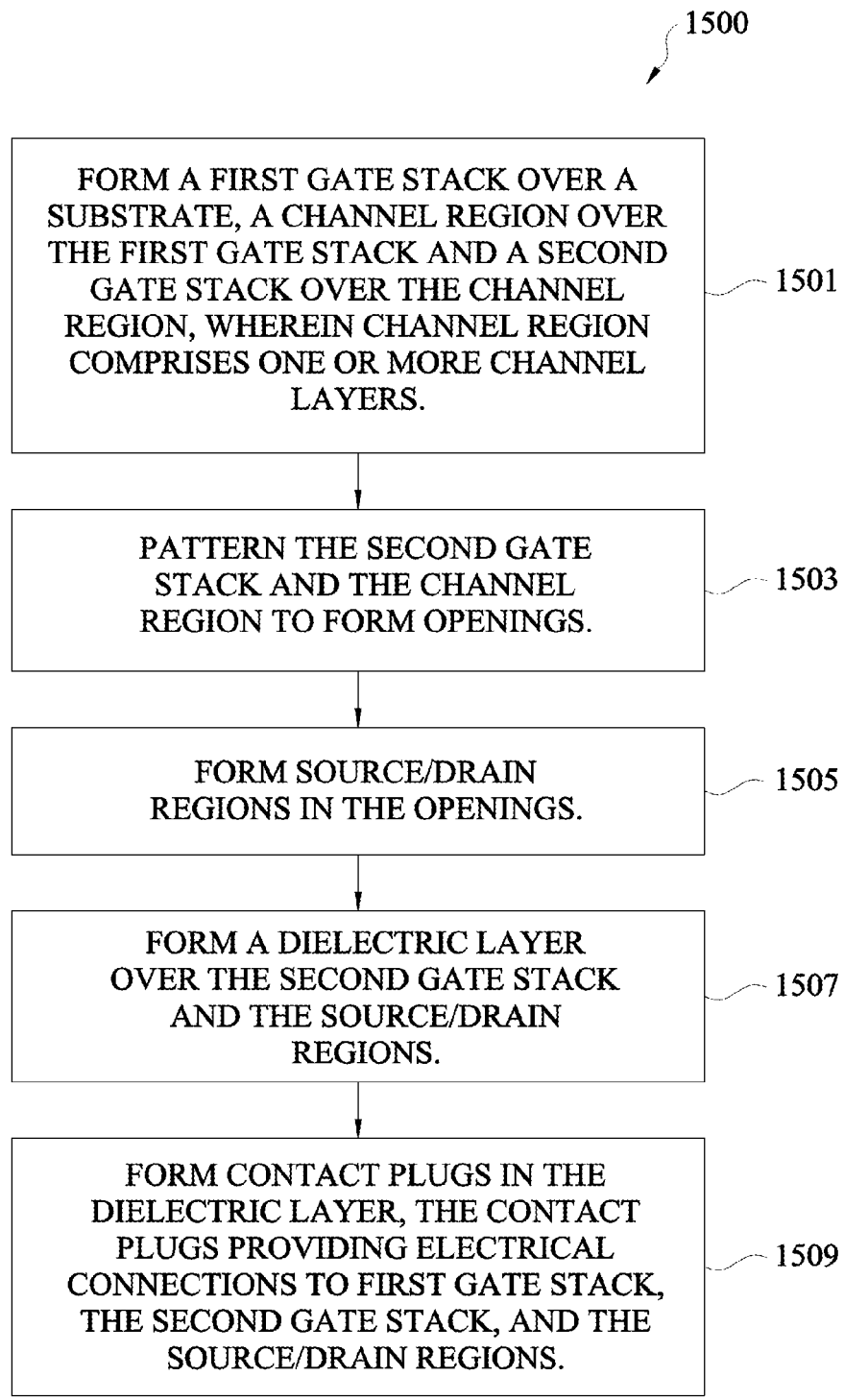
FIG. 15 is a flow diagram illustrating a method of forming a semiconductor device in accordance with some embodiments.

FIG. 15 is a flow diagram illustrating a method 1500 of forming a semiconductor device in accordance with some embodiments. The method starts at step 1501, wherein a first gate stack (such as the first gate stack 201) is formed over a substrate, a channel region (such as the channel region 203) is formed over the first gate stack and a second gate stack (such as the second gate stack 205) is formed over the channel region as described above with reference to FIGS. 1A-2C. In some embodiments, the channel region comprises one or more channel layers (such as the first channel layer 109 and/or the first channel layer 109). In step 1503, the second gate stack and the channel region are patterned to form openings (such as the first opening 301 and the second opening 303) as described above with reference to FIGS. 3A-3C. In step 1505, source/drain regions (such as the first source/drain regions 401 and the second source/drain regions 403) are formed in the openings as described above with reference to FIGS. 4A-4C. In step 1507, a dielectric layer (such as the ILD 501) is formed over the second gate stack and the source/gate regions as described above with reference to FIGS. 5A-5C. In step 1509, contact plugs (such as the first contact plug 601, the second contact plug 603, the third contact plug 605 and the fourth contact plug 607) are formed in the dielectric layer, wherein the contact plugs provide electrical connections to the first gate stack, the second gate stack and the source/drain regions as described above with reference to FIGS. 5A-6C.

Figure 16A:
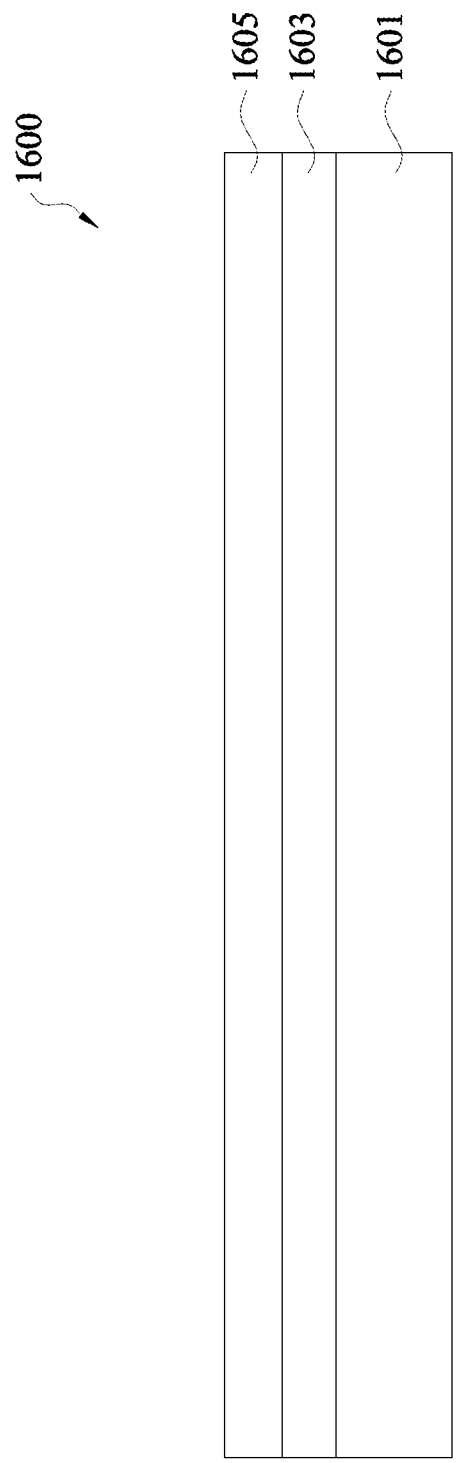
FIGS. 16A-16C illustrate various cross-sectional views of a fabrication process of a semiconductor device in accordance with some embodiments.
Figure 16B:
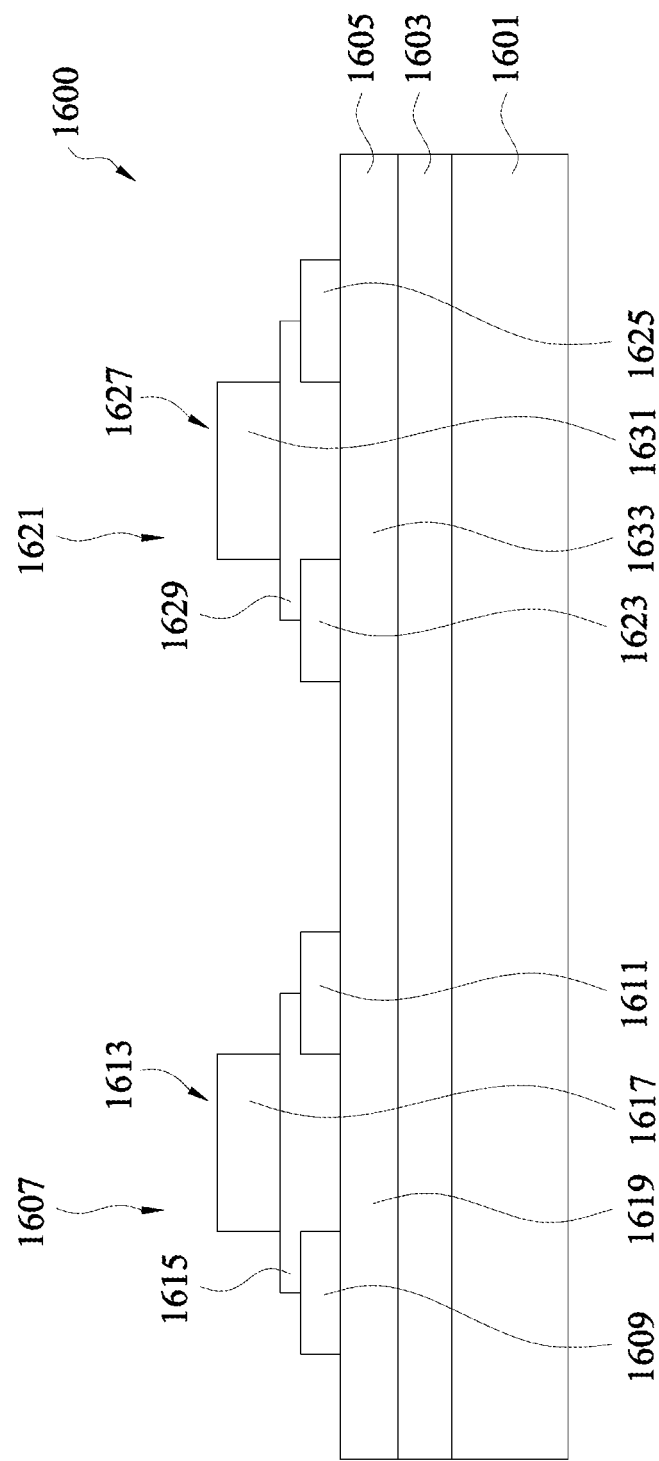
Figure 16C:
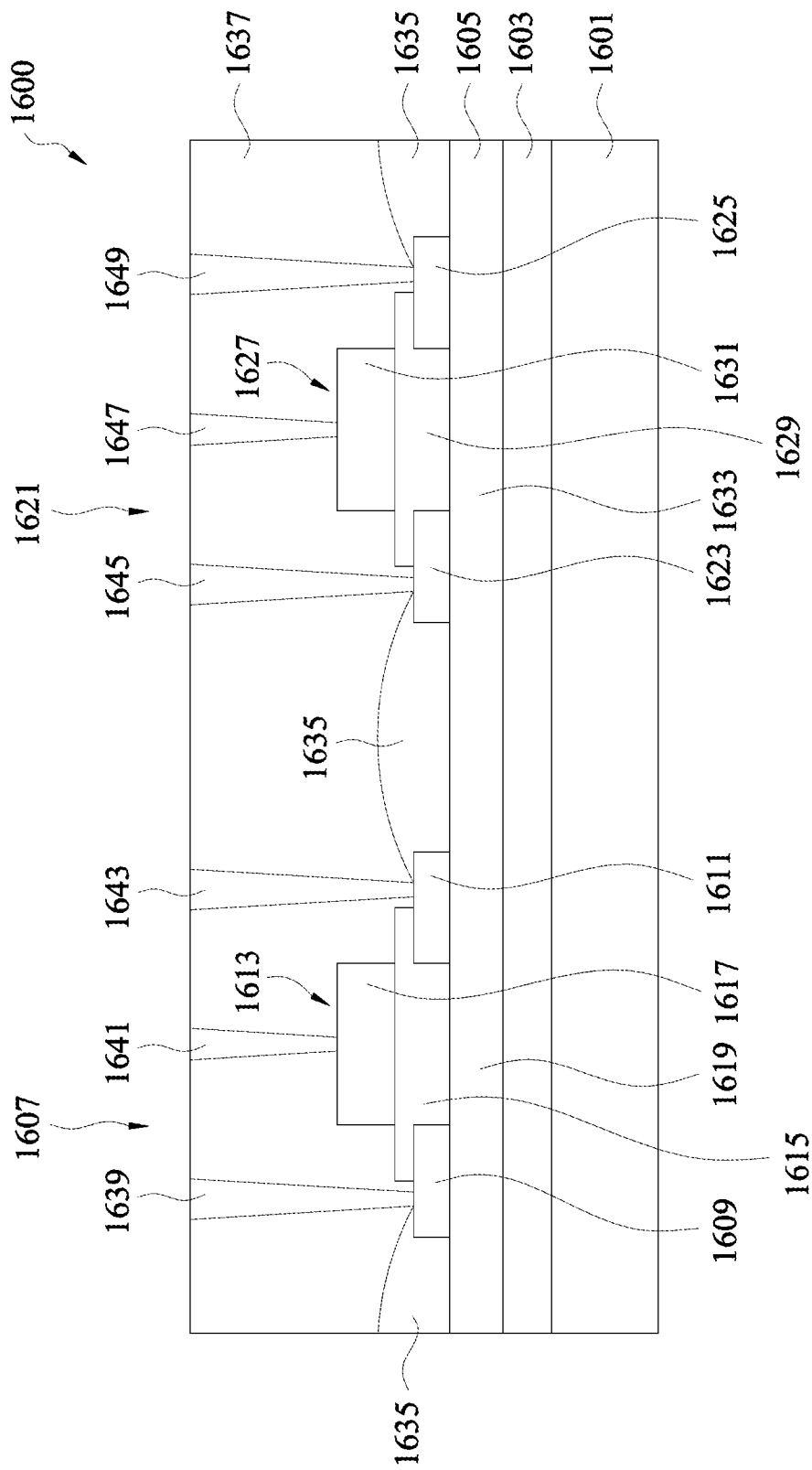

FIGS. 16A-16C illustrate various cross-sectional views of a fabrication process of a semiconductor device 1600 in accordance with some embodiments. As described below in greater detail, in the illustrated embodiment, a single layer of a 2D material will be used to form channel regions of a plurality of FETs. Referring to FIG. 16A, a portion of a substrate 1601 is shown having a dielectric layer 1603 and a 2D material layer 1605 formed thereon, such that the dielectric layer 1603 is interposed between the 2D material layer 1605 and the substrate 1601. In some embodiments, the substrate 1601 and the dielectric layer 1603 may be formed using similar material and methods as the substrate 101 and the first dielectric layer 103, respectively, described above with reference to FIGS. 1A-1C, and the description is not repeated herein. In some embodiments, the 2D material layer 1605 may comprise one to a few monolayers of 2D topological insulators, TMDCs, graphene, BN, or the like, and may be formed using CVD, ALD, the like, or a combination therefore. In some embodiments, the use of 2D topological insulators may be more advantageous than the use of TMDCs or graphene. Generally, a 2D topological insulator has a semiconducting (gapped) bulk and a conducting (gapless) edge due to non-trivial topology of a band structure caused by interaction between spin and orbital degrees of freedom. In some embodiments, FETs having channel regions formed of a 2D topological insulator may have greater on-state currents than FETs with channel regions formed of a TMDC, and better gating characteristics and smaller off-state currents than FETs with channel regions formed of graphene. Exemplary 2D topological insulators include heterostructures such as CdTe/HgTe, InAs/GaSb, and the like, stanene (a single layer of Sn atoms forming a hexagonal lattice), and various decorated stanenes having a generic chemical formula SnX, with X=F, Br, Cl, I, wherein each X atom forms a chemical bond with a corresponding Sn atom of stanene and neighboring X atoms are located on opposite sides of a plane formed by Sn atoms. In some embodiments, the decorated stanenes (SnX) may be formed by first forming stanene using molecular beam epitaxy (MBE), ALD, or the like at a process temperature of less than about 250° C. Subsequently, halogen atoms (X) are introduced into stanene using CVD, or the like at a process temperature of about 400° C. In some embodiments, the 2D material layer 1605 may have a thickness between about 2 nm and about 3 nm. In some embodiments wherein the 2D material layer 1605 comprises a single monolayer of a 2D topological insulator such as Fluorinated Stanene (SnF), the 2D material layer 1605 has a thickness of about 4.5 Å.

Referring to FIG. 16B, in some embodiments, a first FET 1607 and a second FET 1621 are formed over the substrate 1601. In some embodiments, the first FET 1607 comprises a first source/drain region 1609, a second source/drain region 1611 and a first gate stack 1613. In some embodiments, a portion of the 2D material layer 1605 disposed below the first gate stack 1613 forms a first channel region 1619 of the first FET 1607. In some embodiments, the first gate stack 1613 comprises a first gate electrode layer 1617 disposed over the first gate dielectric layer 1615, such that portions of the first gate dielectric layer 1615 extend over the first source/drain region 1609 and the second source/drain region 1611. In some embodiments, the second FET 1621 comprises a third source/drain region 1623, a fourth source/drain region 1625 and a second gate stack 1627. In some embodiments, a portion of the 2D material layer 1605 disposed below the second gate stack 1627 forms a second channel region 1633 of the second FET 1621. In some embodiments, the second gate stack 1627 comprises a second gate electrode layer 1631 disposed over a second gate dielectric layer 1629, such that portions of the second gate dielectric layer 1629 extend over the third source/drain region 1623 and the fourth source/drain region 1625.

Referring further to FIG. 16B, in some embodiments, the first source/drain region 1609, the second source/drain region 1611, the third source/drain region 1623, and the fourth source/drain region 1625 may comprise a metallic material such as gold, silver, aluminum, copper, tungsten, molybdenum, nickel, titanium, or alloys thereof, and may be formed using PVD, ALD, electro-chemical plating, electroless plating, the like, or a combination thereof. In some embodiments, a metallic material is formed over the 2D material layer 1605. Subsequently, the metallic material is patterned to form the first source/drain region 1609, the second source/drain region 1611, the third source/drain region 1623, and the fourth source/drain region 1625. In some embodiments, the metallic material may be patterned using suitable lithography and etching methods.

In other embodiments, before depositing a metallic material, a photoresist material (not shown) is formed over the 2D material layer 1605. The photoresist material is then masked, exposed, and developed to expose portions of the 2D material layer 1605 and to define a pattern for the first source/drain region 1609, the second source/drain region 1611, the third source/drain region 1623, and the fourth source/drain region 1625. The metallic material is formed over the photoresist material and the exposed portions of the 2D material layer 1605 using, for example, PVD methods such as evaporation, sputtering, the like, or a combination thereof. Subsequently, the photoresist material and portions of the metallic material formed on the photoresist material are stripped off the 2D material layer 1605 leaving behind the first source/drain region 1609, the second source/drain region 1611, the third source/drain region 1623, and the fourth source/drain region 1625. In some embodiments, the first source/drain region 1609, the second source/drain region 1611, the third source/drain region 1623, and the fourth source/drain region 1625 may be formed of a same material. In other embodiments, the first source/drain region 1609 and the second source/drain region 1611 may be formed of a first material while the third source/drain region 1623 and the fourth source/drain region 1625 may formed of a second material, wherein the second material is different from the first material.

In some embodiments, the first gate dielectric layer 1615 and the second gate dielectric layer 1629 may be formed using similar materials and methods as the first gate dielectric layer 107 described above with reference to FIGS. 1A-1C and the description is not repeated herein. In some embodiments, the first gate electrode layer 1617 and the second gate electrode layer 1631 may be formed using similar materials and methods as the first gate electrode layer 105 described above with reference to FIGS. 1A-1C and the description is not repeated herein. In some embodiments, a dielectric material is formed over the 2D material layer 1605, the first source/drain region 1609, the second source/drain region 1611, the third source/drain region 1623, and the fourth source/drain region 1625 and a conductive material is formed over the dielectric material. Subsequently, the dielectric material and the conductive material are patterned to form the first gate stack 1613 and the second gate stack 1627. In some embodiments, the patterning process may include suitable lithography and etching methods. In some embodiments, the first gate dielectric layer 1615 and the second gate dielectric layer 1629 may be formed of a same material. In other embodiments, the first gate dielectric layer 1615 and the second gate dielectric layer 1629 may be formed of different materials. In some embodiments, the first gate electrode layer 1617 and the second gate electrode layer 1631 may be formed of a same material. In other embodiments, the first gate electrode layer 1617 and the second gate electrode layer 1631 may be formed of different materials.

Referring to FIG. 16C, in some embodiments, isolation regions 1635 are formed over exposed portions of the 2D material layer 1605. The isolation regions 1635 electrically isolate the first FET 1607 from the second FET 1621, and the first FET 1607 and the second FET 1621 from other devices formed on the substrate 1601. In some embodiments, the isolation regions 1635 may comprise suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon oxide, a polymer such as polyimide, combinations of these, or the like, and may be formed using thermal oxidation, CVD, a spin-on coating process, the like, or a combination thereof.

Referring further to FIG. 16C, in some embodiments, an ILD 1637 is formed over the first FET 1607 and the second FET 1621. In some embodiments, the ILD 1637 may be formed using similar materials and method as the ILD 501, described above with reference to FIGS. 5A-5C, and the description is not repeated herein. Subsequently, contact plugs 1639, 1641, 1643, 1645, 1647 and 1649 are formed in the ILD 1637 using similar material and methods as the first contact plug 601, the second contact plug 603, the third contact plug 605 and the fourth contact plug 607, described above with reference to FIGS. 5A-6C, and the description is not repeated herein. In the illustrated embodiment, the contact plug 1639 extends through the ILD 1637 and contacts the first source/drain region 1609, the contact plug 1641 extends through the ILD 1637 and contacts the first gate electrode layer 1617, the contact plug 1643 extends through the ILD 1637 and contacts the second source/drain region 1611, the contact plug 1645 extends through the ILD 1637 and contacts the third source/drain region 1623, the contact plug 1647 extends through the ILD 1637 and contacts the second gate electrode layer 1631, and the contact plug 1649 extends through the ILD 1637 and contacts the fourth source/drain region 1625. In the illustrated embodiment, the semiconductor device 1600 comprises two FETs (such as the first FET 1607 and the second FET 1621). However, in other embodiments, the semiconductor device 1600 may comprise more than two FETs depending on design requirements for the semiconductor device 1600.

In some embodiments, further manufacturing steps may be performed on the semiconductor device 1600. For example, metallization layers (not shown) may be formed over the ILD 1637. The metallization layers may comprise one or more dielectric layers, and one or more conductive features formed in the one or more dielectric layers. In some embodiments, the metallization layers are in electrical contact with the contact plugs 1639, 1641, 1643, 1645, 1647 and 1649, and electrically interconnect the first FET 1607 and the second FET 1621 to other devices formed on the substrate 1601. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 1601 may be singulated into separate dies, which may further undergo various packaging processes.

Figure 17:
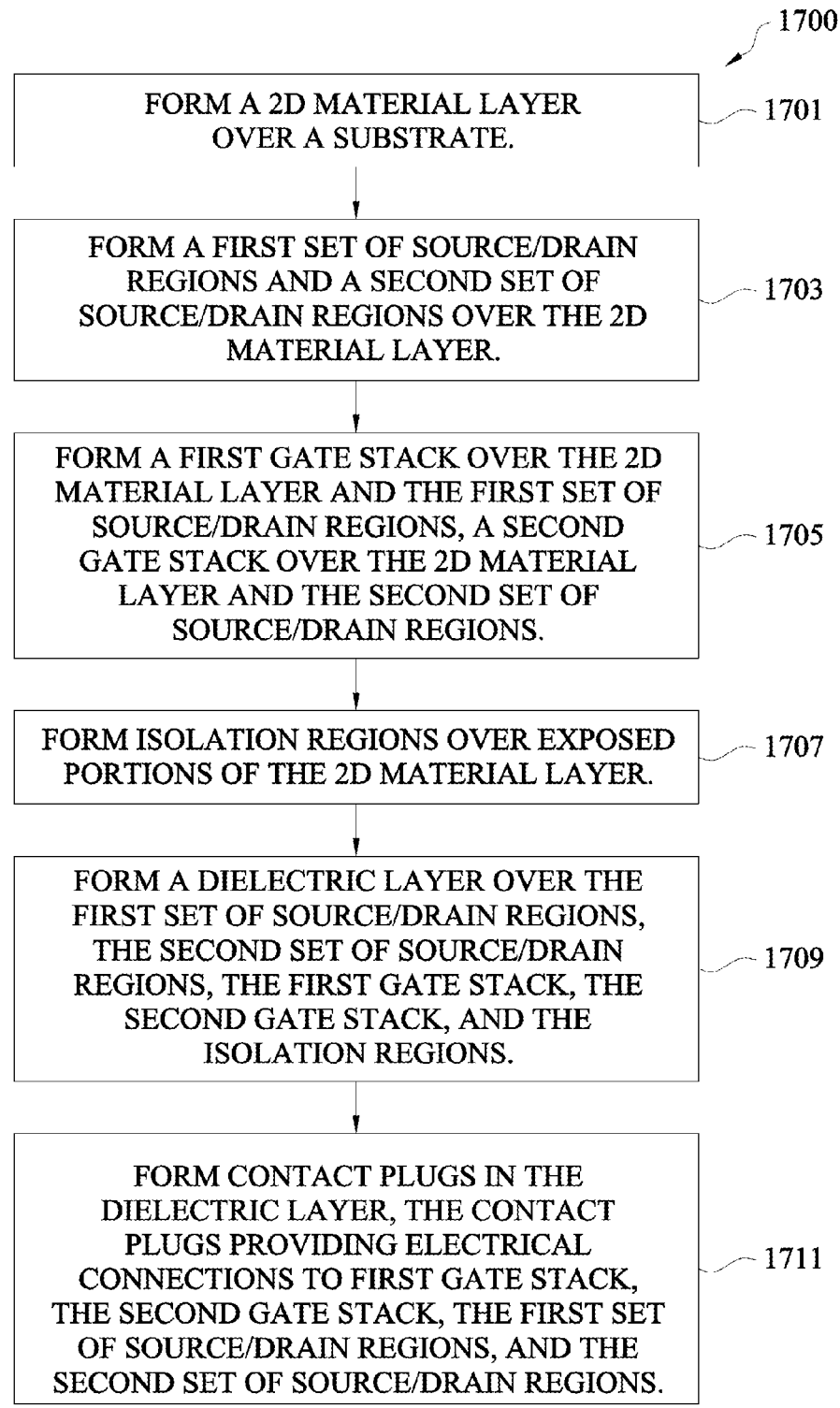
FIG. 17 is a flow diagram illustrating a method of forming a semiconductor device in accordance with some embodiments.

FIG. 17 is a flow diagram illustrating a method 1700 of forming a semiconductor device in accordance with some embodiments. The method 1700 starts with step 1701, wherein a 2D material layer (such as the 2D material layer 1605) is formed over a substrate (such as the substrate 1605) as described above with reference to FIG. 16A. In step 1703, a first set of source/drain regions (such as the first source/drain region 1609 and the second source/drain region 1611) and a second set of source/drain regions (such as the third source/drain region 1623 and the fourth source/drain region 1625) are formed over the 2D material layer as described above with reference to FIG. 16B. In step 1705, a first gate stack (such as the first gate stack 1613) is formed over the 2D material layer and the first set of source/drain regions, and a second gate stack (such as the second gate stack 1627) is formed over the 2D material layer and the second set of source/drain regions as described above with reference to FIG. 16B. In step 1707, isolation regions (such as the isolation regions 1635) are formed over exposed portions of the 2D material layer as described above with reference to FIG. 16C. In step 1709, a dielectric layer (such as the ILD 1637) is formed over the first set of source/drain regions, the second set of source/drain regions, the first gate stack, the second gate stack, and the isolation regions as described above with reference to FIG. 16C. In step 1711, contact plugs (such as the contact plugs 1639, 1641, 1643, 1645, 1647 and 1649) are formed in the dielectric layer, wherein the contact plugs provide electrical connections to the first gate stack, the second gate stack, the first set of source/drain regions, and the second set of source/drain regions as described above with reference to FIG. 16C.

The embodiments of the present disclosure have various advantageous features. In particular, by using 2D topological insulators as channel layers, on-state current of a FET may be increased due to conducting (gapless) edges of the 2D topological insulators. Furthermore, by embedding a source/drain region in a semiconducting (gapped) bulk of a channel layer (formed of a 2D topological insulator), off-state current of a FET may be reduced and gating characteristics of the FET may be improved. In some embodiments, a single 2D material layer may be used to form channel regions for a plurality of FETs.

According to an embodiment, a semiconductor device includes a channel region over a substrate, the channel region comprising one or more channel layers, and a first gate stack over the substrate, the first gate stack being interposed between the substrate and the channel region. The semiconductor device further includes a first source/drain region, the first source/drain region extending through at least one channel layer of the one or more channel layers, the first source/drain region being surrounded by the at least one channel layer of the one or more channel layers in a plan view.

According to another embodiment, a semiconductor device includes a first gate dielectric layer and a first gate electrode layer over a substrate, the first gate electrode layer being interposed between the substrate and the first gate dielectric layer, and one or more channel layers, the first gate dielectric layer being interposed between the first gate electrode layer and the one or more channel layers. The semiconductor device further includes a second gate dielectric layer, the one or more channel layers being interposed between the first gate dielectric layer and the second gate dielectric layer, and a first source/drain region, the first source/drain region extending through the second gate dielectric layer and at least one channel layer of the one or more channel layers, sidewalls of the first source/drain region being spaced apart from edges of the at least one channel layer of the one or more channel layers.

According to yet another embodiment, a method of forming a semiconductor device, the method includes forming a first gate electrode layer over a substrate. A first gate dielectric layer is formed over the first gate electrode layer. A first channel layer is formed over the first gate dielectric layer. An isolation layer is formed over the first channel layer. A second channel layer is formed over the isolation layer. A second gate dielectric layer is formed over the second channel layer. The second gate dielectric layer, the second channel layer, the isolation layer and the first channel layer are patterned to form a first opening, the first opening extending through the second gate dielectric layer, the second channel layer and the isolation layer, and into the first channel layer. A first source/drain region is formed in the first opening, sidewalls of the first source/drain region being spaced apart from edges of the first channel layer and edges of the second channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first gate electrode layer over a substrate;
    forming a first gate dielectric layer over the first gate electrode layer;
    forming a first channel layer over the first gate dielectric layer;
    forming an isolation layer over the first channel layer;
    forming a second channel layer over the isolation layer;
    forming a second gate dielectric layer over the second channel layer;
    patterning the second gate dielectric layer, the second channel layer, the isolation layer and the first channel layer to form a first opening, the first opening extending through the second gate dielectric layer, the second channel layer and the isolation layer, and into the first channel layer; and
    forming a first source/drain region in the first opening, sidewalls of the first source/drain region being spaced apart from edges of the first channel layer and edges of the second channel layer.

2. The method of claim 1, wherein the first channel layer and the second channel layer comprise a 2D topological insulator material.

3. The method of claim 1, wherein patterning the second gate dielectric layer, the second channel layer, the isolation layer and the first channel layer further comprises forming a second opening, the second opening extending through the second gate dielectric layer, the second channel layer and the isolation layer, and into the first channel layer, the second opening being different from the first opening.

4. The method of claim 3, further comprises forming a second source/drain region in the second opening, sidewalls of the second source/drain region being spaced apart from the edges of the first channel layer and the edges of the second channel layer.

5. The method of claim 1, wherein patterning the second gate dielectric layer, the first channel layer, the isolation layer and the second channel layer further comprises exposing a portion of the first gate dielectric layer.

6. The method of claim 5, further comprises forming a second source/drain region over a portion of the first gate dielectric layer, the second source/drain region contacting one of the edges of the first channel layer and one of the edges of the second channel layer.

7. A method of forming a semiconductor device, the method comprising:
    depositing a first conductive layer over a substrate;
    depositing a first dielectric layer over the first conductive layer;
    depositing a first topological insulator layer over the first dielectric layer;
    depositing an isolation layer over the first topological insulator layer;
    depositing a second topological insulator layer over the isolation layer;
    depositing a second dielectric layer over the second topological insulator layer;
    etching the second dielectric layer, the second topological insulator layer, the isolation layer and the first topological insulator layer to form a first opening, a sidewall of the first opening being within the second dielectric layer, the second topological insulator layer, the isolation layer, and the first topological insulator layer, a bottom of the first opening exposing a first portion of the first topological insulator layer; and
    filling the first opening with a first conductive material.

8. The method of claim 7, further comprising etching the second dielectric layer, the second topological insulator layer, the isolation layer and the first topological insulator layer to expose a portion of the first dielectric layer.

9. The method of claim 8, further comprising depositing a second conductive material over the portion of the first dielectric layer.

10. The method of claim 7, wherein a topmost surface of the first conductive material is above a topmost surface of the second dielectric layer.

11. The method of claim 7, further comprising etching the second dielectric layer, the second topological insulator layer, the isolation layer, the first topological insulator layer and the first dielectric layer to expose a portion of the first conductive layer.

12. The method of claim 7, further comprising etching the second dielectric layer, the second topological insulator layer, the isolation layer and the first topological insulator layer to form a second opening, a sidewall of the second opening being within the second dielectric layer, the second topological insulator layer, the isolation layer, and the first topological insulator layer, a bottom of the second opening exposing a second portion of the first topological insulator layer.

13. The method of claim 12, further comprising filling the second opening with a second conductive material.

14. A method of forming a semiconductor device, the method comprising:
    forming a first gate stack over a substrate;
    forming a channel stack over the first gate stack;
    patterning the channel stack to form a first opening, sidewall and a bottom of the first opening being within the channel stack; and
    filling the first opening with a first conductive material,
    wherein forming the channel stack comprises:
    depositing a first topological insulator layer over the first gate stack;

depositing an isolation layer over the first topological insulator layer; and depositing a second topological insulator layer over the isolation layer.

15. The method of claim 14, wherein the bottom of the first opening exposes a portion of the first topological insulator layer.

16. The method of claim 14, further comprising patterning the channel stack to expose a portion of a gate dielectric layer of the first gate stack.

17. The method of claim 16, further comprising depositing a second conductive material over the portion of the gate dielectric layer.

18. The method of claim 14, further comprising patterning the first gate stack and the channel stack to expose a gate electrode layer of the first gate stack.

19. The method of claim 14, further comprising forming a second gate stack over the channel stack.

* * * * *